(12) United States Patent
Kwon et al.

(10) Patent No.: US 12,495,653 B2
(45) Date of Patent: Dec. 9, 2025

(54) DISPLAY DEVICE, METHOD OF MANUFACTURING THE SAME, AND TILED DISPLAY DEVICE INCLUDING THE SAME

(71) Applicant: Samsung Display Co., LTD., Yongin-si (KR)

(72) Inventors: Yong Hoon Kwon, Suwon-si (KR); Mi Sun Kim, Suwon-si (KR); Byung Hoon Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 423 days.

(21) Appl. No.: 18/093,499

(22) Filed: Jan. 5, 2023

(65) Prior Publication Data

US 2023/0317903 A1 Oct. 5, 2023

(30) Foreign Application Priority Data

Mar. 29, 2022 (KR) ........................ 10-2022-0039070

(51) Int. Cl.
| | | |
|---|---|---|
| H10H 20/857 | (2025.01) | |
| G09F 9/302 | (2006.01) | |
| H01L 25/075 | (2006.01) | |
| H10H 20/01 | (2025.01) | |
| H10H 20/831 | (2025.01) | |

(52) U.S. Cl.
CPC ......... *H10H 20/857* (2025.01); *G09F 9/3026* (2013.01); *H01L 25/0753* (2013.01); *H10H 20/01* (2025.01); *H10H 20/8312* (2025.01); *H10H 20/032* (2025.01); *H10H 20/0364* (2025.01)

(58) Field of Classification Search
None
See application file for complete search history.

(56) References Cited

U.S. PATENT DOCUMENTS

2014/0264951 A1* 9/2014 Faruqui ............... H01L 23/5389
438/118
2022/0335883 A1 10/2022 Kim et al.

FOREIGN PATENT DOCUMENTS

| CN | 115207044 | 10/2022 |
|---|---|---|
| JP | 2017-161887 | 9/2017 |
| KR | 10-2022-0142597 | 10/2022 |

OTHER PUBLICATIONS

Naoto Morita et al., "Direct micro-carbonization inside polymer using focused femtosecond laser pulses", Applied Physics Letters, Nov. 19, 2014, pp. 1-5, vol. 105, No. 20.

* cited by examiner

*Primary Examiner* — Nicholas J Tobergte
(74) *Attorney, Agent, or Firm* — Womble Bond Dickinson (US) LLP

(57) ABSTRACT

A display includes a substrate including a first contact hole and a residual film of the substrate overlapping each other in a thickness direction, an electric conductor provided in the residual film and having conductivity, a first barrier insulating film disposed on the substrate and including a second contact hole, a fan-out line disposed in a first metal layer on the first barrier insulating film and including a pad disposed in the second contact hole, the pad electrically contacting the electric conductor, a display layer disposed on the fan-out line, and a flexible film disposed below the substrate, extending to the first contact hole, and electrically connected to the pad through the electric conductor.

20 Claims, 20 Drawing Sheets

SP: SP1, SP2, SP3

DISPLAY DEVICE, METHOD OF MANUFACTURING THE SAME, AND TILED DISPLAY DEVICE INCLUDING THE SAME

CROSS-REFERENCE TO RELATED APPLICATION(S)

This application claims priority to and benefits of Korean Patent Application No. 10-2022-0039070 under 35 U.S.C. § 119, filed on Mar. 29, 2022, in the Korean Intellectual Property Office (KIPO), the entire contents of which are incorporated herein by reference.

BACKGROUND

1. Technical Field

Embodiments relate to a display device, a method of manufacturing the same, and a tiled display device including the same.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among flat panel display devices, a light emitting display device may display an image without a backlight unit providing light to a display panel because each of pixels of the display panel includes light emitting elements that may emit light by themselves.

When the display device is manufactured in a great size, a defective rate of the light emitting elements may increase due to an increase in the number of pixels, and productivity or reliability may decrease. In order to solve such a problem, a tiled display device may form a screen having a great size by connecting multiple display devices having a relatively small size to each other. The tiled display device may include boundary portions called seams between the display devices due to non-display areas or bezel areas of each of the display devices adjacent to each other. When one image is displayed on the entire screen, the boundary portions between the display devices may give a sense of discontinuity to the entire screen to decrease a degree of immersion of the image.

SUMMARY

Embodiments provide a display device capable of preventing damage to a pad in an etching process of a substrate and decreasing a process time and a manufacturing cost, a method of manufacturing the same, and a tiled display device including the same.

Embodiments also provide a display device capable of preventing a sense of discontinuity between multiple display devices and improving a degree of immersion of an image by preventing boundary portions or non-display areas of the display devices from being recognized, a method of manufacturing the same, and a tiled display device including the same.

Additional features of embodiments will be set forth in the description which follows, and in part may be apparent from the description, or may be learned by practice of an embodiment or embodiments herein.

According to an embodiment, a display may include a substrate including a first contact hole and a residual film of the substrate overlapping each other in a thickness direction, an electric conductor provided in the residual film and having conductivity, a first barrier insulating film disposed on the substrate and including a second contact hole, a fan-out line disposed in a first metal layer on the first barrier insulating film and including a pad disposed in the second contact hole, the pad electrically contacting the electric conductor, a display layer disposed on the fan-out line, and a flexible film disposed below the substrate, extending to the first contact hole, and electrically connected to the pad through the electric conductor.

The substrate may include an organic insulating material, and the electric conductor may be formed by micro-carbonizing the residual film.

The electric conductor may be formed by irradiating the residual film with infrared laser beam having a femtosecond pulse to micro-carbonize the residual film.

A thickness of the residual film may be in a range of about 1/20 to about 1/5 of a thickness of the substrate.

A thickness of the substrate may be in a range of about 5 μm to about 20 μm, and a thickness of the residual film may be in a range of about 0.5 μm to about 2 μm.

The display device may further include a connection film disposed between the electric conductor and the flexible film and electrically connecting the electric conductor and the flexible film.

The display layer may include a connector disposed in a second metal layer on the first metal layer and electrically connected to the fan-out line, a data line disposed in the second metal layer and extending in a first direction, and a high potential line disposed in the second metal layer and extending in the first direction.

The pad may supply a data voltage to the data line through the connector. The pad may supply a high potential voltage to the high potential line through the connector.

The display layer may further include a thin film transistor disposed in an active layer and a third metal layer on the second metal layer, and a connection electrode disposed in a fourth metal layer on the third metal layer. An end of the connection electrode may be electrically connected to the high potential line, and another end of the connection electrode may be electrically connected to the thin film transistor.

The display layer may further include a light emitting element layer disposed on the fourth metal layer. The light emitting element layer may include a first electrode electrically connected to the thin film transistor, a second electrode disposed in a same layer as the first electrode, and light emitting elements disposed between the first electrode and the second electrode and electrically connected between the first electrode and the second electrode.

The display device may further include a display driver disposed on the flexible film and supplying a data voltage, a source voltage, or a gate signal.

According to an embodiment, a method of manufacturing a display device, may include preparing a substrate, forming a first barrier insulating film on the substrate, the first barrier insulating layer including a first contact hole, forming a fan-out line on the first barrier insulating film, the fan-out line including a pad in the first contact hole, forming a display layer on the fan-out line, forming a second contact hole so that a residual film of the substrate remains, forming an electric conductor by carbonizing the residual film by irradiating the residual film with infrared laser beam, and electrically connecting a flexible film to the electric conductor by disposing a portion of the flexible film in the second contact hole.

The infrared laser beam may have a femtosecond pulse.

The forming of the second contact hole may include etching the substrate so that a thickness of the residual film is in a range of about 1/20 to about 1/5 of a thickness of the substrate.

The preparing of the substrate may include forming the substrate with a thickness in a range of about 5 µm to about 20 µm. The forming of the second contact hole may include etching the substrate so that a thickness of the residual film is in a range of about 0.5 µm to about 2 µm.

The forming of the second contact hole may include irradiating the substrate with ultraviolet laser beam.

The ultraviolet laser beam may have a picosecond pulse.

The electrically connecting of the flexible film to the electric conductor may include electrically connecting the flexible film to the electric conductor with a connection film.

The electrically connecting of the flexible film to the electric conductor may include attaching the flexible film to the electric conductor by ultrasonic bonding or thermocompression bonding.

According to an embodiment, a tiled display device may include a plurality of display devices each including a display area including a plurality of pixels and a non-display area disposed adjacent to the display area, and a connecting member connecting the plurality of display devices to each other. At least one of the plurality of display devices may include a substrate including a first contact hole and a residual film of the substrate overlapping each other in a thickness direction, an electric conductor provided in the residual film and having conductivity, a first barrier insulating film disposed on the substrate and including a second contact hole, a fan-out line disposed on the first barrier insulating film and including a pad disposed in the second contact hole, the pad electrically contacting the electric conductor, a display layer disposed on the fan-out line, and a flexible film disposed below the substrate, extending to the first contact hole, and electrically connected to the pad through the electric conductor.

According to an embodiment, damage to a pad may be prevented by making a residual film of a substrate remain in an etching process of the substrate, and since the display device includes an electric conductor provided in the residual film of the substrate, a separate etching process for etching the residual film of the substrate may be omitted, and a process time and a manufacturing cost may be reduced.

According to an embodiment, an area of a non-display area of the display device may be minimized by electrically connecting a display driver disposed below the substrate and a connector disposed on the substrate to each other. Accordingly, in the display device, the method of manufacturing the same, and the tiled display device including the same, it is possible to prevent a user from recognizing non-display areas of or boundary portions between a plurality of display devices by minimizing an interval between the plurality of display devices.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which.

DETAILED DESCRIPTION OF THE EMBODIMENTS

Figure 1:
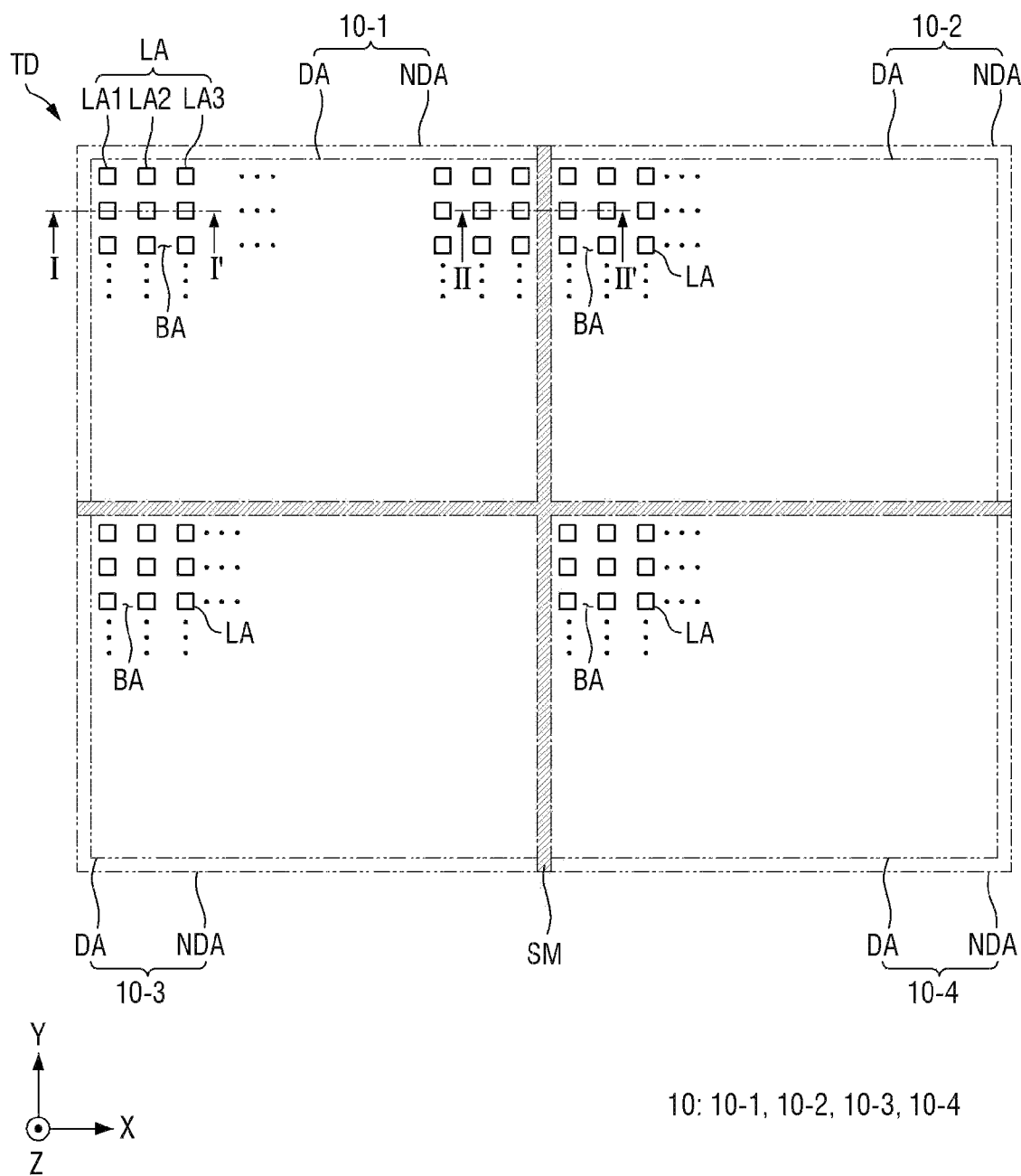
FIG. 1 is a plan view illustrating a tiled display device according to an embodiment.

The embodiments will now be described more fully hereinafter with reference to the accompanying drawings. The embodiments may, however, be provided in different forms and should not be construed as limiting. The same reference numerals indicate the same components throughout the disclosure. In the accompanying figures, the thickness of layers and regions may be exaggerated for clarity.

Some of the parts which are not associated with the description may omitted in order to simplify the description.

It will be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, partly covering, or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. Also, when an element is referred to as being "in contact" or "contacted" or the like to another element, the element may be in "electrical contact" or in "physical contact" with another element; or in "indirect contact" or in "direct contact" with another element. It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a plan view illustrating a tiled display device according to an embodiment.

Referring to FIG. 1, a tiled display device TD may include multiple display devices 10. The display devices 10 may be arranged in a lattice pattern, but are not limited thereto. The display devices 10 may be connected to each other in a first direction (X-axis direction) and/or a second direction (Y-axis direction), and the tiled display device TD may have a specific shape. In an embodiment, the display devices 10 may have a same size, but are not limited thereto. In another embodiment, the display devices 10 may have different sizes.

The tiled display device TD may include first to fourth display devices 10-1 to 10-4. The number of display devices 10 and a connection relationship between the display devices 10 are not limited to those of the embodiment of FIG. 1. The number of display devices 10 may be determined according to sizes of each of the display devices 10 and the tiled display device TD.

Each of the display devices 10 may have a rectangular shape including long sides and short sides. The display devices 10 may be arranged with long sides or short sides connected to each other. Some display devices 10 may be disposed at edges of the tiled display device TD, and may form a side of the tiled display device TD. Another display devices 10 may be disposed at corners of the tiled display device TD, and may form two adjacent sides of the tiled display device TD. The other display devices 10 may be disposed in the tiled display device TD, and may be surrounded by other display devices 10.

Each of the display devices 10 may include a display area DA and a non-display area NDA. The display area DA may include multiple pixels to display an image. Each of the pixels may include an organic light emitting diode including an organic light emitting layer, a quantum dot light emitting diode including a quantum dot light emitting layer, a micro light emitting diode, or an inorganic semiconductor light emitting diode including an inorganic semiconductor. Hereinafter, it will be described that each of the pixels includes an inorganic light emitting diode, but the disclosure is not limited thereto. The non-display area NDA may be disposed adjacent to the display area DA or surround the display area DA, and may not display an image.

The display device 10 may include pixels arranged in multiple rows and columns in the display area DA. Each of the pixels may include an emission area LA defined by a pixel defining film or a bank, and may emit light having a predetermined (or selectable) peak wavelength through the emission area LA. For example, the display area DA of the display device 10 may include first to third emission areas LA1, LA2, and LA3. Each of the first to third emission areas LA1, LA2, and LA3 may be an area in which light generated by a light emitting element of the display device 10 is emitted to the outside of the display device 10.

The first to third emission areas LA1, LA2, and LA3 may emit light having a peak wavelength to the outside of the display device 10. The first emission area LA1 may emit light of a first color, the second emission area LA2 may emit light of a second color, and the third emission area LA3 may emit light of a third color. For example, the light of the first color may be red light having a peak wavelength in the range of about 610 nm to about 650 nm, the light of the second color may be green light having a peak wavelength in the range of about 510 nm to about 550 nm, and the light of the third color may be blue light having a peak wavelength in the range of about 440 nm to about 480 nm, but the disclosure is not limited thereto.

The first to third emission areas LA1, LA2, and LA3 may be sequentially and repeatedly disposed in the first direction (X-axis direction) of the display area DA. In an embodiment, an area of the third emission area LA3 may be greater than that of the first emission area LA1, and an area of the first emission area LA1 may be greater than that of the second emission area LA2, but the disclosure is not limited thereto. In another embodiment, an area of the first emission area LA1, an area of the second emission area LA2, and an area of the third emission area LA3 may be substantially the same as each other.

The display area DA of the display device 10 may include light blocking areas BA surrounding the emission areas LA. The light blocking areas BA may prevent color mixing of light emitted from the first to third emission areas LA1, LA2, and LA3.

The tiled display device TD may have an overall planar shape, but is not limited thereto. The tiled display device TD may have a three-dimensional shape to provide a three-dimensional effect to a user. In an embodiment, in case that the tiled display device TD has a three-dimensional shape, at least some of the display devices 10 may have a curved shape. In another embodiment, the display devices 10 may have a planar shape and may be connected to each other with a predetermined (or selectable) angle, such that the tiled display device TD has a three-dimensional shape.

The tiled display device TD may include connecting areas SM disposed between the display areas DA. The tiled display device TD may be formed by connecting the non-display areas NDA of adjacent display devices 10 to each other. The display devices 10 may be connected to each other by connecting members or adhesive members disposed in the connecting areas SM. The connecting area SM may not include pads or flexible films attached to the pads. Accordingly, a distance between the display areas DA of adjacent display devices 10 may be too small in the connecting areas SM to be recognized by a user. An external light reflectivity of each of the display areas DA may be substantially the same as an external light reflectivity of the connecting areas SM. Accordingly, the tiled display device TD may prevent a sense of discontinuity between the display devices 10 and improve a degree of immersion of an image by preventing the connecting areas SM between the display devices 10 from being recognized by a user.

Figure 2:
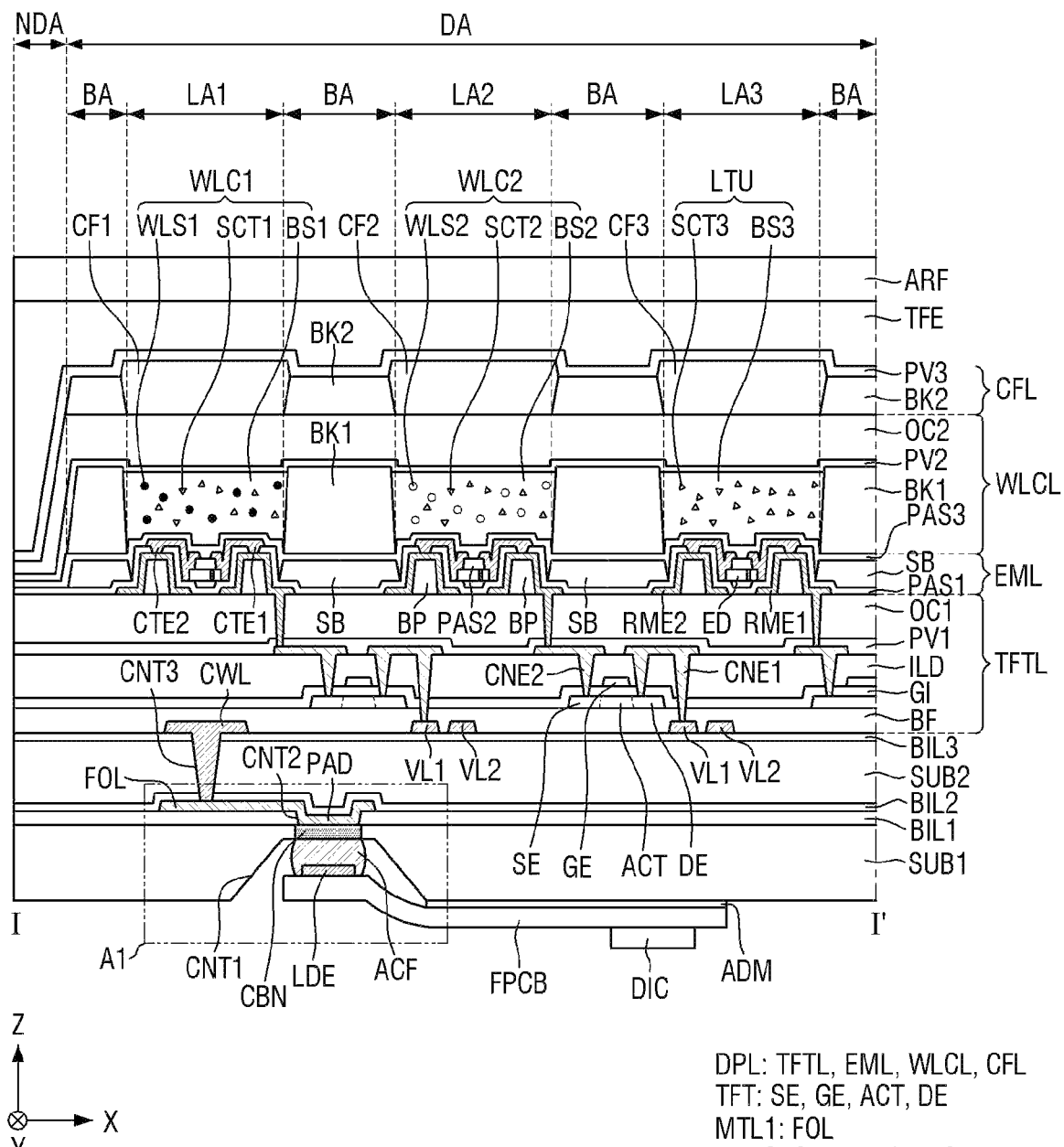
FIG. 2 is a schematic cross-sectional view taken along line I-I' of FIG. 1.
Figure 3:
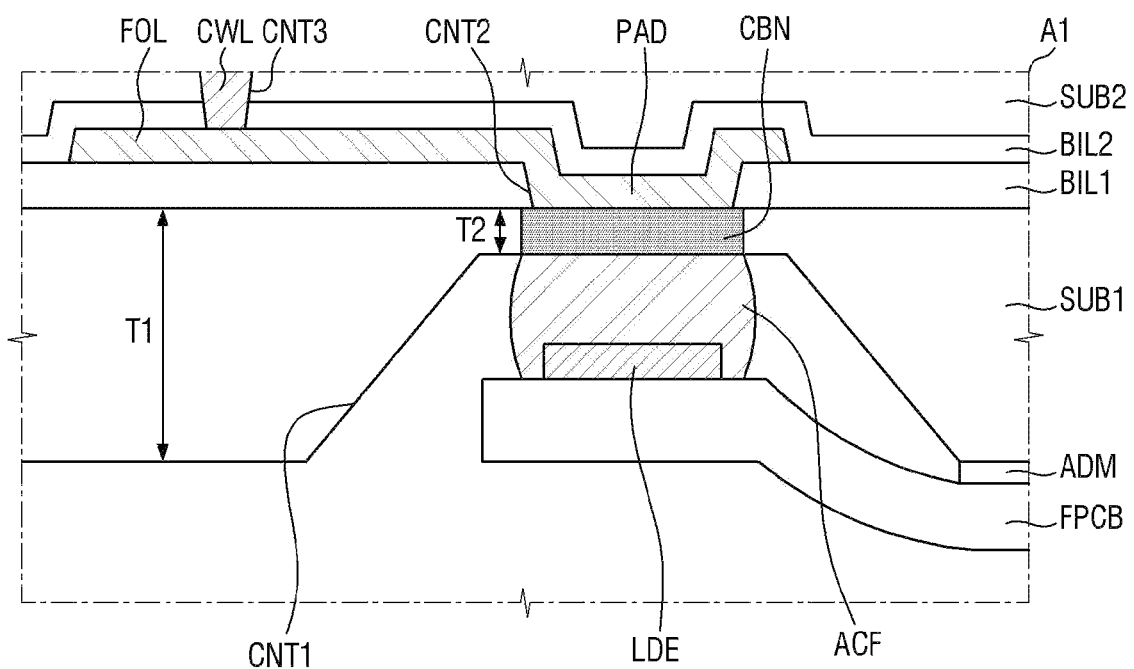
FIG. 3 is an enlarged view of area A1 of FIG. 2.

FIG. 2 is a schematic cross-sectional view taken along line I-I' of FIG. 1, and FIG. 3 is an enlarged view of area A1 of FIG. 2.

Referring to FIGS. 2 and 3, the display area DA of the display device 10 may include first to third emission areas LA1, LA2, and LA3. Each of the first to third emission areas LA1, LA2, and LA3 may be an area in which light generated by light emitting elements ED of the display device 10 is emitted to the outside of the display device 10.

The display device 10 may include a first substrate SUB1, a first barrier insulating film BIL1 a first metal layer MTL1, a second barrier insulating film BIL2, a second substrate SUB2, a third barrier insulating film BIL3, a display layer DPL, an encapsulation layer TFE, an anti-reflection film ARF, a flexible film FPCB, and a display driver DIC.

The first substrate SUB1 may support the display device 10. The first substrate SUB1 may be a base substrate or a base member. The first substrate SUB1 may be a flexible substrate that may be bent, folded, or rolled. For example, the first substrate SUB1 may include an insulating material such as a polymer resin, for example, polyimide PI, but is not limited thereto. In another embodiment, the first substrate SUB1 may be a rigid substrate including a glass material.

The first substrate SUB1 may include a first contact hole CNT1. The first contact hole CNT1 may be formed so that a residual film of the first substrate SUB1 remains. The first contact hole CNT1 may be etched from a lower surface of the first substrate SUB1 to penetrate to the residual film of an upper portion of the first substrate SUB1. A width of a lower portion of the first contact hole CNT1 may be greater than a width of the upper portion of the first contact hole CNT1. For example, a second thickness T2 of the residual film of the first substrate SUB1 may be about ⅒ of a first thickness T1 of the first substrate SUB1, but is not limited thereto. In case that the first thickness T1 of the first substrate SUB1 is about 10 μm, the second thickness T2 of the residual film of the first substrate SUB1 may be about 1 μm. Since the second thickness T2 of the residual film of the first substrate SUB1 is about ⅒ of the first thickness T1 of the first substrate SUB1, the first substrate SUB1 may stably support the display device 10, and the residual film of the first substrate SUB1 may prevent damage to a pad PAD. In an embodiment, the first thickness T1 of the first substrate SUB1 may be in a range of about 5 to about 20 μm, and the second thickness T2 of the residual film of the first substrate SUB1 may be in a range of about 0.5 to about 2 μm.

The residual film of the first substrate SUB1 may include an electric conductor CBN. The electric conductor CBN may have conductivity and may be disposed between the pad PAD and a connection film ACF. The electric conductor CBN may electrically connect the pad PAD to a lead electrode LDE of the flexible film FPCB. The electric conductor CBN may be formed by carbonizing the residual film of the first substrate SUB1. For example, the residual film of the first substrate SUB1 may be irradiated with an infrared laser beam having a femtosecond pulse to be micro-carbonized, such that the electric conductor CBN may be formed. The pulse of the infrared laser beam may be several femtoseconds to several picoseconds. In a process of manufacturing the display device 10, the electric conductor CBN may be exposed by the first contact hole CNT1, and the pad PAD may be electrically connected to the lead electrode LDE of the flexible film FPCB inserted into (or extending to) the first contact hole CNT1 through the electric conductor CBN.

Accordingly, the display device 10 may prevent damage to the pad PAD by leaving the residual film of the first substrate SUB1 in a process of forming the first contact hole CNT1. Since the display device 10 includes the electric conductor CBN provided in the residual film of the first substrate SUB1, a separate etching process for etching the residual film of the first substrate SUB1 may be omitted, and a process time and a manufacturing cost may be reduced.

The first barrier insulating film BIL1 may be disposed on the first substrate SUB1. The first barrier insulating film BIL1 may include an inorganic film capable of preventing penetration of air or moisture. The first barrier insulating film BIL1 may include at least one of a silicon nitride layer, a silicon oxynitride layer, a silicon oxide layer, a titanium oxide layer, an aluminum oxide layer, and an amorphous silicon layer.

The first barrier insulating film BIL1 may include a second contact hole CNT2. The second contact hole CNT2 may be etched from an upper surface of the first barrier insulating film BIL1 to penetrate to a lower surface of the first barrier insulating film BIL1. For example, a width of an upper portion of the second contact hole CNT2 may be greater than a width of a lower portion of the second contact hole CNT2.

The first metal layer MTL1 may be disposed on the first barrier insulating film BIL1. The first metal layer MTL1 may include a fan-out line FOL. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The pad PAD may be integral with the fan-out line FOL and inserted into (or disposed in) the second contact hole CNT2. The pad PAD may electrically connect the flexible film FPCB and a connector CWL to each other. The pad PAD may be in contact with the electric conductor CBN of the residual film of the first substrate SUB1. The pad PAD may be electrically connected to the lead electrode LDE of the flexible film FPCB through the electric conductor CBN and the connection film ACF. The fan-out line FOL may be electrically connected to a data line, a power line, or a gate line through the connector CWL. The data line or the power line may be electrically connected to a drain electrode DE of a thin film transistor TFT. The gate line may be electrically connected to a gate electrode GE of the thin film transistor TFT. Accordingly, the fan-out line FOL may supply a data voltage, a source voltage, or a gate signal received from the display driver DIC of the flexible film FPCB to the thin film transistor TFT of the pixel through the connector CWL. The display device 10 may include the fan-out line FOL disposed in the display area DA, such that an area of the non-display area NDA may be minimized.

The second barrier insulating film BIL2 may be disposed on the first barrier insulating film BIL1 and the first metal layer MTL1. The second barrier insulating film BIL2 may include an inorganic film capable of preventing penetration of air or moisture. The second barrier insulating film BIL2 may include at least one of a silicon nitride layer, a silicon oxynitride layer, a silicon oxide layer, a titanium oxide layer, an aluminum oxide layer, and an amorphous silicon layer.

The second substrate SUB2 may be disposed on the second barrier insulating film BIL2. The second substrate SUB2 may be a base substrate or a base member. The second substrate SUB2 may be a flexible substrate that may be bent, folded, or rolled. For example, the second substrate SUB2 may include an insulating material such as a polymer resin, for example, polyimide PI, but is not limited thereto.

The third barrier insulating film BIL3 may be disposed on the second substrate SUB2. The third barrier insulating film BIL3 may include an inorganic film capable of preventing penetration of air or moisture. For example, the third barrier insulating film BIL3 may include at least one of a silicon nitride layer, a silicon oxynitride layer, a silicon oxide layer, a titanium oxide layer, an aluminum oxide layer, and an amorphous silicon layer, but is not limited thereto.

The third barrier insulating film BIL3, the second substrate SUB2, and the second barrier insulating film BIL2 may include a third contact hole CNT3. The third contact hole CNT3 may be etched from an upper surface of the third barrier insulating film BIL3 to penetrate to a lower surface of the second barrier insulating film BIL2. For example, a width of an upper portion of the third contact hole CNT3 may be greater than a width of a lower portion of the third contact hole CNT3. In the process of manufacturing the display device 10, an upper surface of the fan-out line FOL may be exposed by the third contact hole CNT3, and the fan-out line FOL may be in contact with the connector CWL inserted into (or disposed in) the third contact hole CNT3.

The display layer DPL may be disposed on the third barrier insulating film BIL3. The display layer DPL may include a thin film transistor layer TFTL a light emitting element layer EML, a wavelength conversion layer WLCL, and a color filter layer CFL. The thin film transistor layer TFTL may include a second metal layer MTL2, a buffer layer BF, an active layer ACTL, a gate insulating film GI, a third metal layer MTL3, an interlayer insulating film ILD, a fourth metal layer MTL4, a first passivation layer PV1, and a first planarization layer OC1.

The second metal layer MTL2 may be disposed on the third barrier insulating film BIL3. The second metal layer MTL2 may include the connector CWL and first and second voltage lines VL1 and VL2. The connector CWL and the first and second voltage lines VL1 and VL2 may be formed of the same material at the same layer, but are not limited thereto. For example, the second metal layer MTL2 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The connector CWL may be inserted into the third contact hole CNT3 to be electrically connected to the fan-out line FOL. For example, the connector CWL may be electrically connected to the data line to supply the data voltage to the thin film transistor TFT. The connector CWL may be electrically connected to the power line to supply the source voltage to the thin film transistor TFT. The connector CWL may be electrically connected to the gate line to supply the gate signal to the gate electrode GE of the thin film transistor TFT. Accordingly, the connector CWL may supply the data voltage, the source voltage, and/or the gate signal received from the display driver DIC through the fan-out line FOL to the thin film transistor TFT of the pixel.

The first and second voltage lines VL1 and VL2 may extend in the second direction (Y-axis direction) in the display area DA. Each of the first and second voltage lines VL1 and VL2 may be electrically connected to the fan-out line FOL. Each of the first and second voltage lines VL1 and VL2 may be electrically connected to the thin film transistor TFT or the light emitting element ED. For example, each of the first and second voltage lines VL1 and VL2 may be a data line, a high potential line, a low potential line, or a sensing line, but is not limited thereto.

The buffer layer BF may be disposed on the second metal layer MTL2 and the third barrier insulating film BIL3. The buffer layer BF may include an inorganic material capable of preventing permeation of air or moisture. For example, the buffer layer BF may include multiple inorganic films that are alternately stacked each other.

The active layer ACTL may be disposed on the buffer layer BF. The active layer ACTL may include a semiconductor region ACT, a drain electrode DE, and a source electrode SE of the thin film transistor TFT. The semiconductor region ACT may overlap the gate electrode GE in a thickness direction (Z-axis direction), and may be insulated from the gate electrode GE by the gate insulating film GI. The drain electrode DE and the source electrode SE may be formed by making a material of the semiconductor region ACT conductive. The thin film transistor TFT may constitute a pixel circuit of each of the pixels. For example, the thin film transistor TFT may be a driving transistor or a switching transistor of the pixel circuit.

The gate insulating film GI may be disposed on the active layer ACTL and the buffer layer BF. The gate insulating film GI may insulate the semiconductor region ACT and the gate electrode GE of the thin film transistor TFT from each other. The gate insulating film GI may include a contact hole through which each of first and second connection electrodes CNE1 and CNE2 penetrates.

The third metal layer MTL3 may be disposed on the gate insulating film GI. The third metal layer MTL3 may include the gate electrode GE of the thin film transistor TFT. The gate electrode GE may overlap the semiconductor region ACT with the gate insulating film GI interposed therebetween. The gate electrode GE may receive a gate signal from the gate line. For example, the third metal layer MTL3 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The interlayer insulating film ILD may be disposed on the third metal layer MTL3. The interlayer insulating film ILD may insulate the third and fourth metal layers MTL3 and MTL4 from each other. The interlayer insulating film ILD may include a contact hole through which each of the first and second connection electrodes CNE1 and CNE2 penetrates.

The fourth metal layer MTL4 may be disposed on the interlayer insulating film ILD. The fourth metal layer MTL4 may include the first and second connection electrodes CNE1 and CNE2. The first and second connection electrodes CNE1 and CNE2 may be formed of the same material at the same layer, but are not limited thereto. For example, the fourth metal layer MTL4 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The first connection electrode CNE1 may electrically connect the first voltage line VL1 and the drain electrode DE of the thin film transistor TFT to each other. An end of the first connection electrode CNE1 may be in contact with the first voltage line VL1 of the second metal layer MTL2, and another end of the first connection electrode CNE1 may be in contact with the drain electrode DE of the active layer ACTL.

The second connection electrode CNE2 may electrically connect the source electrode SE of the thin film transistor TFT and a first electrode RME1 to each other. An end of the second connection electrode CNE2 may be in contact with the source electrode SE of the active layer ACTL, and the first electrode RME1 of the light emitting element layer EML may be in contact with another end of the second connection electrode CNE2.

The first passivation layer PV1 may be disposed on the fourth metal layer MTL4 and the interlayer insulating film ILD. The first passivation layer PV1 may protect the thin film transistor TFT. The first passivation layer PV1 may include a contact hole through which the first electrode RME1 penetrates.

The first planarization layer OC1 may be provided on the first passivation layer PV1 to planarize an upper surface of the thin film transistor layer TFTL. For example, the first planarization layer OC1 may include a contact hole through which the first electrode RME1 penetrates. The contact hole of the first planarization layer OC1 may extend to the contact hole of the first passivation layer PV1. The first planarization layer OC1 may include an organic insulating material such as polyimide (PI).

The light emitting element layer EML may be disposed on the thin film transistor layer TFTL. The light emitting element layer EML may include protrusion patterns BP, a first electrode RME1, a second electrode RME2, a first insulating film PAS1, a sub-bank SB, light emitting elements ED, a second insulating film PAS2, a first contact electrode CTE1, a second contact electrode CTE2, and a third insulating film PAS3.

The protrusion patterns BP may be disposed on the first planarization layer OC1. The protrusion patterns BP may protrude from an upper surface of the first planarization layer OC1. Multiple protrusion patterns BP may be disposed in emission areas LA or opening areas of each of the pixels. Multiple light emitting elements ED may be disposed between the protrusion patterns BP. The protrusion patterns BP may have inclined side surfaces, and light emitted from the light emitting elements ED may be reflected by the first and second electrodes RME1 and RME2 disposed on the protrusion patterns BP. For example, the protrusion pattern BP may include an organic insulating material such as polyimide PI.

The first electrode RME1 may be disposed on the first planarization layer OC1 and the protrusion pattern BP. The first electrode RME1 may be disposed on the protrusion pattern BP disposed on sides of the light emitting elements ED. The first electrode RME1 may be disposed on the inclined side surface of the protrusion pattern BP to reflect the light emitted from the light emitting elements ED. The first electrode RME1 may be inserted into the contact hole formed in the first planarization layer OC1 and the first passivation layer PV1 to be electrically connected to the second connection electrode CNE2. The first electrode RME1 may be electrically connected to end of the light emitting elements ED through the first contact electrode CTE1. For example, the first electrode RME1 may receive a voltage proportional to luminance of the light emitting element ED from the thin film transistor TFT of the pixel.

The second electrode RME2 may be disposed on the first planarization layer OC1 and the protrusion pattern BP. The second electrode RME2 may be disposed on the protrusion pattern BP disposed on another sides of the light emitting elements ED. The second electrode RME2 may be disposed on the inclined side surface of the protrusion pattern BP to reflect the light emitted from the light emitting elements ED. The second electrode RME2 may be electrically connected to the another ends of the light emitting elements ED through the second contact electrode CTE2. For example, the second electrode RME2 may receive a low potential voltage supplied to all pixels from the low potential line.

The first and second electrodes RME1 and RME2 may include a conductive material having a high reflectivity. In an embodiment, the first and second electrodes RME1 and RME2 may include at least one of aluminum (Al), silver (Ag), copper (Cu), nickel (Ni), and lanthanum (La). In another embodiment, the first and second electrodes RME1 and RME2 may include a material such as indium tin oxide (ITO), indium zinc oxide (IZO), or indium tin zinc oxide (ITZO). In another embodiment, the first and second electrodes RME1 and RME2 may include multiple layers of a transparent conductive material layer and a metal layer having a high reflectivity or include a single layer including a transparent conductive material and a metal having a high reflectivity. The first and second electrodes RME1 and RME2 may have a stacked structure such as ITO/Ag/ITO/, ITO/Ag/IZO, or ITO/Ag/ITZO/IZO.

The first insulating film PAS1 may be disposed on the first planarization layer OC1 and the first and second electrodes RME1 and RME2. The first insulating film PAS1 may insulate the first and second electrodes RME1 and RME2 from each other while protecting the first and second electrodes RME1 and RME2. The first insulating film PAS1 may prevent the light emitting elements ED from being in direct contact with and damaged by the first and second electrodes RME1 and RME2 in a process of aligning the light emitting elements ED.

The sub-bank SB may be disposed on the first insulating film PAS1 in the light blocking areas BA. The sub-bank SB may be disposed at boundaries between pixels to divide the light emitting elements ED of each of the pixels. The sub-bank SB may have a predetermined (or selectable) height and may include an organic insulating material such as polyimide PI.

The light emitting elements ED may be disposed on the first insulating film PAS1. The light emitting elements ED may be aligned in parallel with each other between the first and second electrodes RME1 and RME2. A length of the light emitting element ED may be greater than a distance between the first and second electrodes RME1 and RME2. The light emitting element ED may include multiple semiconductor layers, and may have an end defined as a first semiconductor layer and another end opposite to the end and defined as a second semiconductor layer. An end of the light emitting element ED may be disposed on the first electrode RME1, and another end of the light emitting element ED may be disposed on the second electrode RME2. The end of the light emitting element ED may be electrically connected to the first electrode RME1 through the first contact electrode CTE1, and the another end of the light emitting element ED may be electrically connected to the second electrode RME2 through the second contact electrode CTE2.

The light emitting elements ED may have a size of a micro-meter or a nano-meter, and may be inorganic light emitting diodes including an inorganic material. The light emitting elements ED may be aligned between the first and second electrodes RME1 and RME2 in response to an electric field formed in a specific direction between the first and second electrodes RME1 and RME2 facing each other.

For example, the light emitting elements ED may include active layers having the same material to emit light of the same wavelength band or light of the same color. Light emitted from each of the first to third emission areas LA1, LA2, and LA3 of the light emitting element layer EML may have the same color. For example, the light emitting elements ED may emit light of a third color or blue light having a peak wavelength in the range of about 440 nm to about 480 nm, but are not limited thereto.

The second insulating film PAS2 may be disposed on the light emitting elements ED. For example, the second insulating film PAS2 may partially surround the light emitting elements ED and may not cover both ends of each of the light emitting elements ED. The second insulating film PAS2 may protect the light emitting elements ED and may fix the light emitting elements ED in the process of manufacturing the display device 10. The second insulating film PAS2 may fill spaces between the light emitting elements ED and the first insulating film PAS1.

The first contact electrode CTE1 may be disposed on the first insulating film PAS1, and may be inserted into a contact hole provided in the first insulating film PAS1 to be electrically connected to the first electrode RME1. For example, the contact hole of the first insulating film PAS1 may be provided on the protrusion pattern BP, but is not limited thereto. An end of the first contact electrode CTE1 may be electrically connected to the first electrode RME1 on the protrusion pattern BP, and another end of the first contact electrode CTE1 may be electrically connected to the end of the light emitting element ED.

The second contact electrode CTE2 may be disposed on the first insulating film PAS1, and may be inserted into a contact hole provided in the first insulating film PAS1 to be electrically connected to the second electrode RME2. For example, the contact hole of the first insulating film PAS1 may be provided on the protrusion pattern BP, but is not limited thereto. An end of the second contact electrode CTE2 may be electrically connected to the another end of the light emitting element ED, and another end of the second contact electrode CTE2 may be electrically connected to the second electrode RME2 on the protrusion pattern BP.

The third insulating film PAS3 may be disposed on the first and second contact electrodes CTE1 and CTE2, the sub-bank SB, and the first and second insulating films PAS1 and PAS2. The third insulating film PAS3 may be disposed on an upper surface of the light emitting element layer EML to protect the light emitting element layer EML.

The wavelength conversion layer WLCL may be disposed on the light emitting element layer EML. The wavelength conversion layer WLCL may include a first light blocking member BK1, a first wavelength conversion portion WLC1, a second wavelength conversion portion WLC2, a light transmission portion LTU, a second passivation layer PV2, and a second planarization layer OC2.

The first light blocking member BK1 may be disposed on the third insulating film PAS3 in the light blocking areas BA. The first light blocking member BK1 may overlap the sub-bank SB in the thickness direction (Z-axis direction). The first light blocking member BK1 may block transmission of light. The first light blocking member BK1 may improve a color reproduction rate of the display device 10 by preventing colors from being mixed with each other due to permeation of the light between the first to third emission areas LA1, LA2, and LA3. The first light blocking member BK1 may be disposed in the form of a lattice surrounding the first to third emission areas LA1, LA2, and LA3 in a plan view.

The first wavelength conversion portion WLC1 may be disposed on the third insulating film PAS3 in the first emission area LA1. The first wavelength conversion portion WLC1 may be surrounded by the first light blocking member BK1. The first wavelength conversion portion WLC1 may convert or shift a peak wavelength of incident light to a first peak wavelength. The first wavelength conversion portion WLC1 may include a first base resin BS1, first scatterers SCT1, and first wavelength shifters WLS1.

The first base resin BS1 may include a material having a relatively high light transmissivity. The first base resin BS1 may be made of a transparent organic material. For example, the first base resin BS1 may include at least one organic materials such as an epoxy-based resin, an acrylic resin, a cardo-based resin, and an imide-based resin.

The first scatterer SCT1 may have a refractive index different from that of the first base resin BS1, and may form an optical interface with the first base resin BS1. For example, the first scatterer SCT1 may include a light scattering material or a light scattering particle scattering at least a portion of transmitted light. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$) or an organic particle such as an acrylic resin or a urethane-based resin. The first scatterer SCT1 may scatter light in a random direction regardless of an incident direction of incident light without substantially converting a peak wavelength of the incident light.

The first wavelength shifter WLS1 may convert or shift the peak wavelength of the incident light to the first peak wavelength. For example, the first wavelength shifter WLS1 may convert the blue light provided from the light emitting layer EML into red light having a single peak wavelength in the range of about 610 nm to about 650 nm and emit the red light. The first wavelength shifter WLS1 may be a quantum dot, a quantum rod, or a phosphor. The quantum dot may be a particulate matter emitting a specific color while electrons are transitioning from a conduction band to a valence band.

A portion of the blue light provided from the light emitting element layer EML may be transmitted through the first wavelength conversion portion WLC1 without being converted into red light by the first wavelength shifter WLS1. Light incident on a first color filter CF1 without being converted by the first wavelength conversion portion WLC1 from the blue light provided from the light emitting element layer EML may be blocked by the first color filter CF1. The red light converted by the first wavelength conversion portion WLC1 from the blue light provided from the light emitting element layer EML may be transmitted through the first color filter CF1 and emitted to the outside. Accordingly, the first emission area LA1 may emit red light.

The second wavelength conversion portion WLC2 may be disposed on the third insulating film PASS in the second emission area LA2. The second wavelength conversion portion WLC2 may be surrounded by the first light blocking member BK1. The second wavelength conversion portion WLC2 may convert or shift a peak wavelength of incident light to a second peak wavelength. The second wavelength conversion portion WLC2 may include a second base resin BS2, second scatterers SCT2, and second wavelength shifters WLS2.

The second base resin BS2 may include a material having a relatively high light transmissivity. The second base resin BS2 may be made of a transparent organic material. For example, the second base resin BS2 may be made of the same material as the first base resin BS1 or be made of the material that may be used for the first base resin BS1.

The second scatterer SCT2 may have a refractive index different from that of the second base resin BS2, and may form an optical interface with the second base resin BS2. For example, the second scatterer SCT2 may include a light scattering material or a light scattering particle scattering at least a portion of transmitted light. For example, the second scatterer SCT2 may be made of the same material as the first scatterer SCT1 or be made of the material that may be used for the first scatterer SCT1.

The second wavelength shifter WLS2 may convert or shift the peak wavelength of the incident light to the second peak wavelength different from the first peak wavelength of the first wavelength shifter WLS1. For example, the second wavelength shifter WLS2 may convert the blue light provided from the light emitting element layer EML into green light having a single peak wavelength in the range of about 510 nm to about 550 nm and emit the green light. The second wavelength shifter WLS2 may be a quantum dot, a quantum rod, or a phosphor. The second wavelength shifter WLS2 may include the material that may be used for the first wavelength shifter WLS1. The second wavelength shifter WLS2 may be a quantum dot, a quantum rod, or a phosphor so that a wavelength conversion range of the second wavelength shifter WLS2 is different from a wavelength conversion range of the first wavelength shifter WLS1.

A portion of the blue light provided from the light emitting element layer EML may be transmitted through the second wavelength conversion portion WLC2 without being converted into green light by the second wavelength shifter WLS2. Light incident on a second color filter CF2 without being converted by the second wavelength conversion portion WLC2 from the blue light provided from the light emitting element layer EML may be blocked by the second color filter CF2. The green light converted by the second wavelength conversion portion WLC2 from the blue light provided from the light emitting element layer EML may be transmitted through the second color filter CF2 and emitted to the outside. Accordingly, the second emission area LA2 may emit green light.

The light transmission portion LTU may be disposed on the third insulating film PAS3 in the third emission area LA3. The light transmission portion LTU may be surrounded by the first light blocking member BK1. The light transmission portion LTU may transmit incident light therethrough while maintaining a peak wavelength of the incident light. The light transmission portion LTU may include a third base resin BS3 and third scatterers SCT3.

The third base resin BS3 may include a material having a relatively high light transmissivity. The third base resin BS3 may be made of a transparent organic material. For example, the third base resin BS3 may be made of the same material as the first or second base resin BS1 or BS2 or be made of the material that may be used for the first base resin BS1.

The third scatterer SCT3 may have a refractive index different from that of the third base resin BS3, and may form an optical interface with the third base resin BS3. For example, the third scatterer SCT3 may include a light scattering material or a light scattering particle scattering at least a portion of transmitted light. For example, the third scatterer SCT3 may be made of the same material as the first or second scatterer SCT1 or SCT2 or be made of the material that may be used for the first scatterer SCT1.

Since the wavelength conversion layer WLCL is directly disposed on the third insulating film PAS3 of the light emitting element layer EML, the display device 10 may not require a separate substrate for the first and second wavelength conversion portions WLC1 and WLC2 and the light transmission portion LTU. Accordingly, the first and second wavelength conversion portions WLC1 and WLC2 and the light transmission portion LTU may be readily aligned in the first to third emission areas LA1, LA2, and LA3, respectively, and a thickness of the display device 10 may be relatively decreased.

The second passivation layer PV2 may cover the first and second wavelength conversion portions WLC1 and WLC2, the light transmission portion LTU, and the first light blocking member BK1. For example, the second passivation layer PV2 may seal the first and second wavelength conversion portions WLC1 and WLC2 and the light transmission portion LTU to prevent damage to or contamination of the first and second wavelength conversion portions WLC1 and WLC2 and the light transmission portion LTU. For example, the second passivation layer PV2 may include an inorganic material.

The second planarization layer OC2 may be disposed on the second passivation layer PV2 to planarize upper surfaces of the first and second wavelength conversion portions WLC1 and WLC2 and the light transmission portion LTU. For example, the second planarization layer OC2 may include an organic insulating material such as polyimide (PI).

The color filter layer CFL may be disposed on the wavelength conversion layer WLCL. The color filter layer CFL may include a second light blocking member BK2, first to third color filters CF1, CF2, and CF3, and a third passivation layer PV3.

The second light blocking member BK2 may be disposed on the second planarization layer OC2 of the wavelength conversion layer WLCL in the light blocking areas BA. The second light blocking member BK2 may overlap the first light blocking member BK1 and/or the sub-bank SB in the thickness direction (Z-axis direction). The second light blocking member BK2 may block transmission of light. The second light blocking member BK2 may improve a color reproduction rate of the display device 10 by preventing colors from being mixed with each other due to permeation of the light between the first to third emission areas LA1, LA2, and LA3. The second light blocking member BK2 may be disposed in the form of a lattice surrounding the first to third emission areas LA1, LA2, and LA3 in a plan view.

The first color filter CF1 may be disposed in the first emission area LA1 on the second planarization layer OC2. The first color filter CF1 may be surrounded by the second light blocking member BK2. The first color filter CF1 may overlap the first wavelength conversion portion WLC1 in the thickness direction (Z-axis direction). The first color filter CF1 may selectively transmit light of a first color (e.g., red light) and block or absorb light of a second color (e.g., green light) and light of a third color (e.g., blue light). For example, the first color filter CF1 may be a red color filter and include a red colorant.

The second color filter CF2 may be disposed on the second planarization layer OC2 in the second emission area LA2. The second color filter CF2 may be surrounded by the second light blocking member BK2. The second color filter CF2 may overlap the second wavelength conversion portion WLC2 in the thickness direction (Z-axis direction). The second color filter CF2 may selectively transmit the light of the second color (e.g., the green light) and block or absorb the light of the first color (e.g., the red light) and the light of the third color (e.g., the blue light). For example, the second color filter CF2 may be a green color filter and include a green colorant.

The third color filter CF3 may be disposed on the second planarization layer OC2 in the third emission area LA3. The third color filter CF3 may be surrounded by the second light blocking member BK2. The third color filter CF3 may overlap the light transmission portion LTU in the thickness direction (Z-axis direction). The third color filter CF3 may selectively transmit the light of the third color (e.g., the blue light) and block or absorb the light of the first color (e.g., the red light) and the light of the second color (e.g., the green light). For example, the third color filter CF3 may be a blue color filter and include a blue colorant.

The first to third color filters CF1, CF2, and CF3 may absorb a portion of light introduced from the outside of the display device 10 to reduce reflected light due to external light. Therefore, the first to third color filters CF1, CF2, and CF3 may prevent distortion of colors due to external light reflection.

Since the first to third color filters CF1, CF2, and CF3 are directly disposed on the second planarization layer OC2 of the wavelength conversion layer WLCL, the display device 10 may not require a separate substrate for the first to third color filters CF1, CF2, and CF3. Accordingly, a thickness of the display device 10 may be relatively decreased.

The third passivation layer PV3 may cover the first to third color filters CF1, CF2, and CF3, and the second light blocking member BK2. The third passivation layer PV3 may protect the first to third color filters CF1, CF2, and CF3.

The encapsulation layer TFE may be disposed on the third passivation layer PV3 of the color filter layer CFL. The encapsulation layer TFE may cover an upper surface and side surfaces of the display layer DPL. For example, the encapsulation layer TFE may include at least one inorganic film to prevent permeation of oxygen or moisture. The encapsulation layer TFE may include at least one organic film to protect the display device 10 from foreign matters such as dust.

The anti-reflection film ARF may be disposed on the encapsulation layer TFE. The anti-reflection film ARF may prevent reflection of external light to suppress a decrease in visibility due to the reflection of the external light. The anti-reflection film ARF may protect an upper surface of the display device 10. The anti-reflection film ARF may be omitted. In another embodiment, the antireflection film ARF may be replaced with a polarizing film.

The flexible film FPCB may be disposed below the first substrate SUB1. The flexible film FPCB may be disposed at an edge of a lower surface of the display device 10. The flexible film FPCB may be attached to a lower surface of the first substrate SUB1 using an adhesive member ADM. The flexible film FPCB may include the lead electrode LDE disposed on an upper surface of a side thereof. The lead electrode LDE may be inserted into the first contact hole CNT1 to be electrically connected to the pad PAD through the connection film ACF and the electric conductor CBN. The flexible film FPCB may support the display driver DIC disposed on a lower surface of another side thereof. The lead electrode LDE may be electrically connected to the display driver DIC through a lead line (not illustrated) disposed on the lower surface of the flexible film FPCB. The another side of the flexible film FPCB may be electrically connected to a source circuit board (not illustrated) below the first substrate SUB1. The flexible film FPCB may transmit a signal and a voltage of the display driver DIC to the display device 10.

The connection film ACF may attach the lead electrode LDE of the flexible film FPCB to the electric conductor CBN. A surface of the connection film ACF may be attached to the electric conductor CBN, and another surface of the connection film ACF may be attached to the lead electrode LDE. For example, the connection film ACF may include an anisotropic conductive film. In case that the connection film ACF includes the anisotropic conductive film, the connection film ACF may have conductivity, and may electrically connect the flexible film FPCB to the fan-out line FOL.

The display driver DIC may be mounted on the flexible film FPCB. The display driver DIC may be an integrated circuit (IC). The display driver DIC may convert digital video data into an analog data voltage based on a data control signal received from a timing controller (not illustrated), and may supply the analog data voltage to the data line of the display area DA through the flexible film FPCB. The display driver DIC may supply a source voltage received from a power supply unit (not illustrated) to the power line of the display area DA through the flexible film FPCB. The display driver DIC may generate multiple gate signals based on gate control signals, and may sequentially supply the gate signals to multiple gate lines according to a set order. The display device 10 may include the fan-out line FOL disposed on the first substrate SUB1 and the display driver DIC disposed below the first substrate SUB1, such that an area of the non-display area NDA may be minimized.

Figure 4:
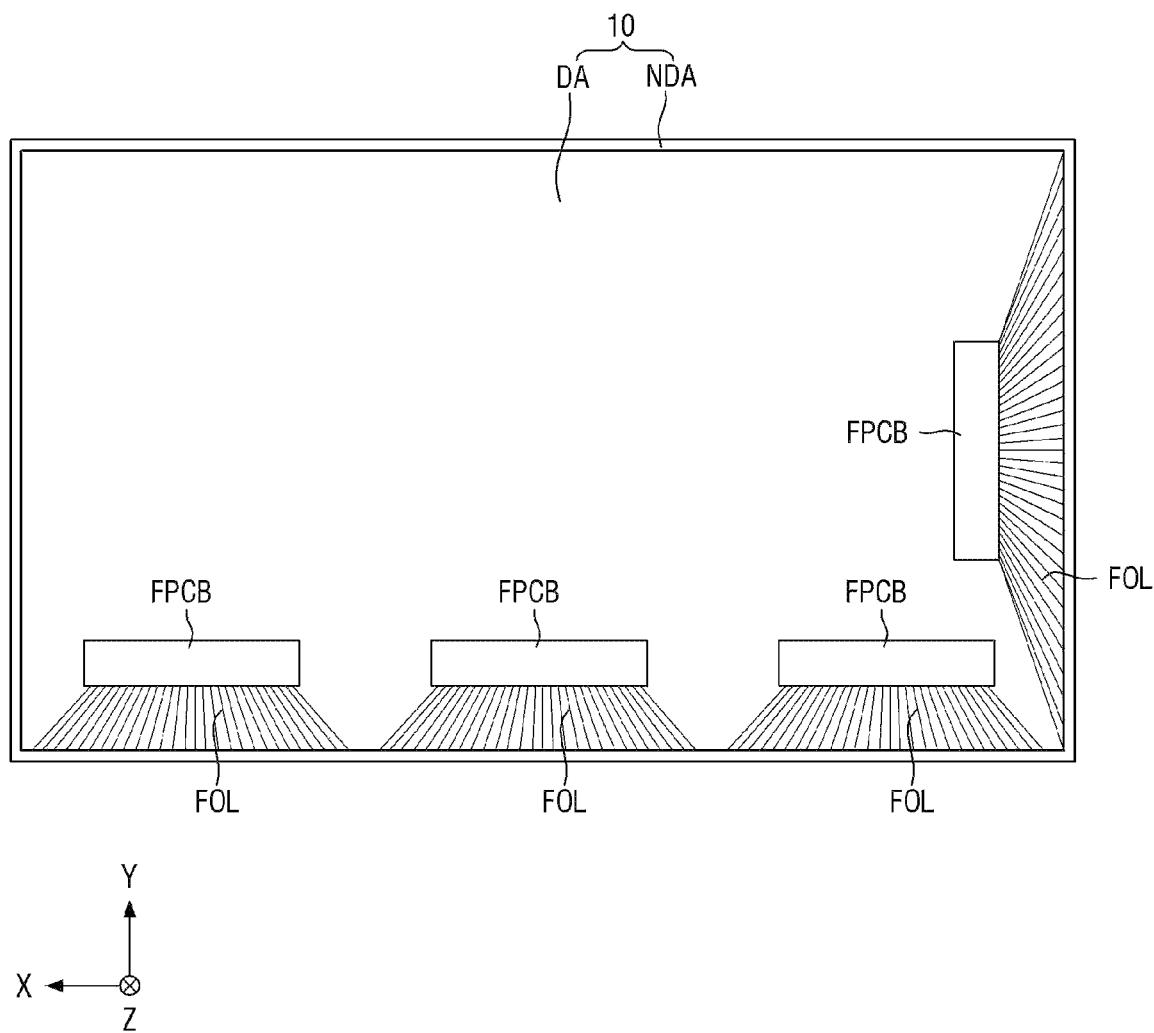
FIG. 4 is a bottom view illustrating a display device according to an embodiment.
Figure 5:
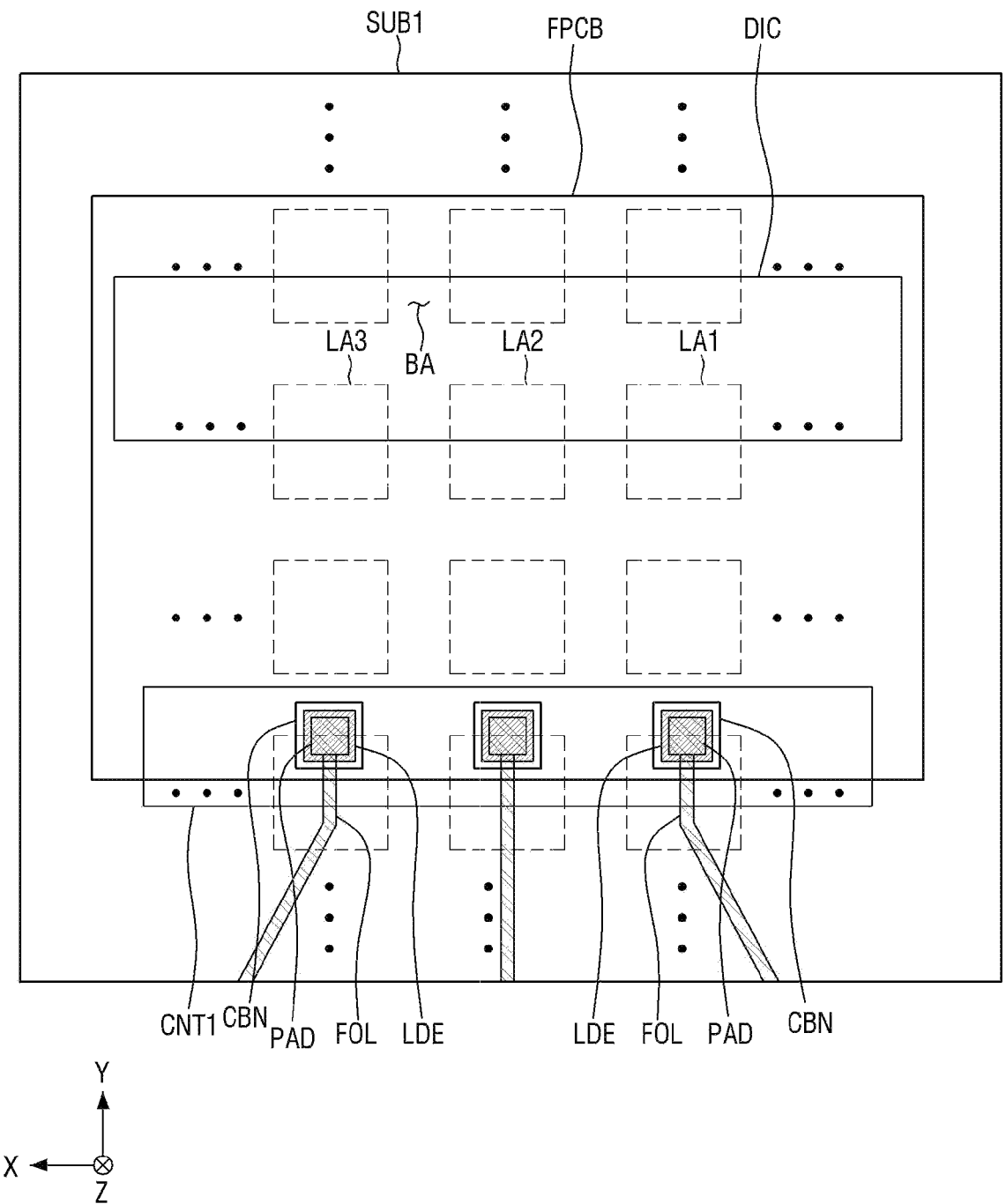
FIG. 5 is an enlarged bottom view illustrating a portion of the display device according to an embodiment.

FIG. 4 is a bottom view illustrating a display device according to an embodiment, and FIG. 5 is an enlarged bottom view illustrating a portion of the display device according to an embodiment.

Referring to FIGS. 4 and 5, the flexible films FPCB, the electric conductors CBN, the pads PAD, and the fan-out lines FOL may be disposed in the display area DA.

The flexible films FPCB may be disposed below the first substrate SUB1. The flexible films FPCB may be disposed at edges of a lower surface of the first substrate SUB1. For example, some of the flexible films FPCB may be disposed at an edge of a long side of the display device 10, and another flexible films FPCB may be disposed at an edge of a short side of the display device 10. The flexible films FPCB disposed at the edge of the long side of the display device 10 may supply data voltages and source voltages, and the flexible films FPCB disposed at the edge of the short side of the display device 10 may supply gate signals, but the disclosure is not limited thereto.

The flexible film FPCB may include the lead electrode LDE. Each of multiple pads PAD may correspond to each of multiple lead electrodes LDE. The lead electrode LDE may be electrically connected to the pad PAD through the connection film ACF and the electric conductor CBN.

The electric conductor CBN may have conductivity and may be disposed between the pad PAD and a connection film ACF. The electric conductor CBN may electrically connect the pad PAD to the lead electrode LDE of the flexible film FPCB. In the process of manufacturing the display device 10, the electric conductor CBN may be exposed by the first contact hole CNT1, and the pad PAD may be electrically connected to the lead electrode LDE of the flexible film FPCB inserted into the first contact hole CNT1 through the electric conductor CBN.

The pad PAD may be inserted into the second contact hole CNT2 of the first barrier insulating film BILL and may be in contact with the electric conductor CBN. The pads PAD disposed at the edge of the long side of the display device 10 may be arranged in the first direction (X-axis direction). The pads PAD disposed at the edge of the short side of the display device 10 may be arranged in the second direction (Y-axis direction).

The fan-out lines FOL may be integral with the pads PAD. The fan-out lines FOL may extend from the pads PAD to the edge of the display device 10. For example, the fan-out lines FOL disposed at the edge of the long side of the display device 10 may extend in the second direction (Y-axis direction) or a direction opposite to the second direction from the flexible film FPCB. The fan-out lines FOL disposed at the edge of the short side of the display device 10 may extend in the first direction (X-axis direction) or a direction opposite to the first direction from the flexible film FPCB. The fan-out lines FOL may be electrically connected to the data lines or the gate lines of the display area DA through the connectors CWL.

Figure 6:
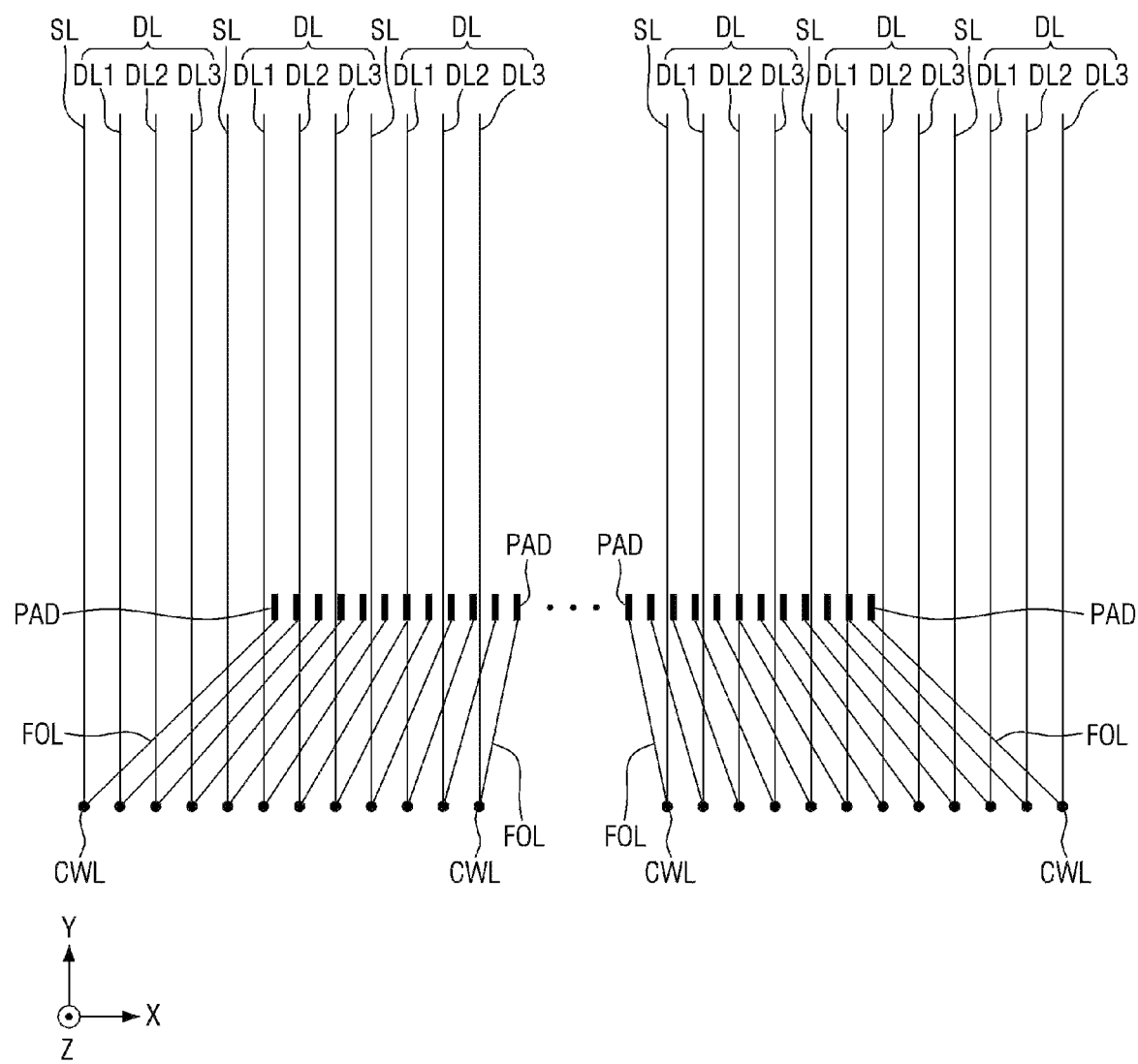
FIG. 6 is a schematic view illustrating pads, fan-out lines, sensing lines, and data lines in the display device according to an embodiment.
Figure 7:
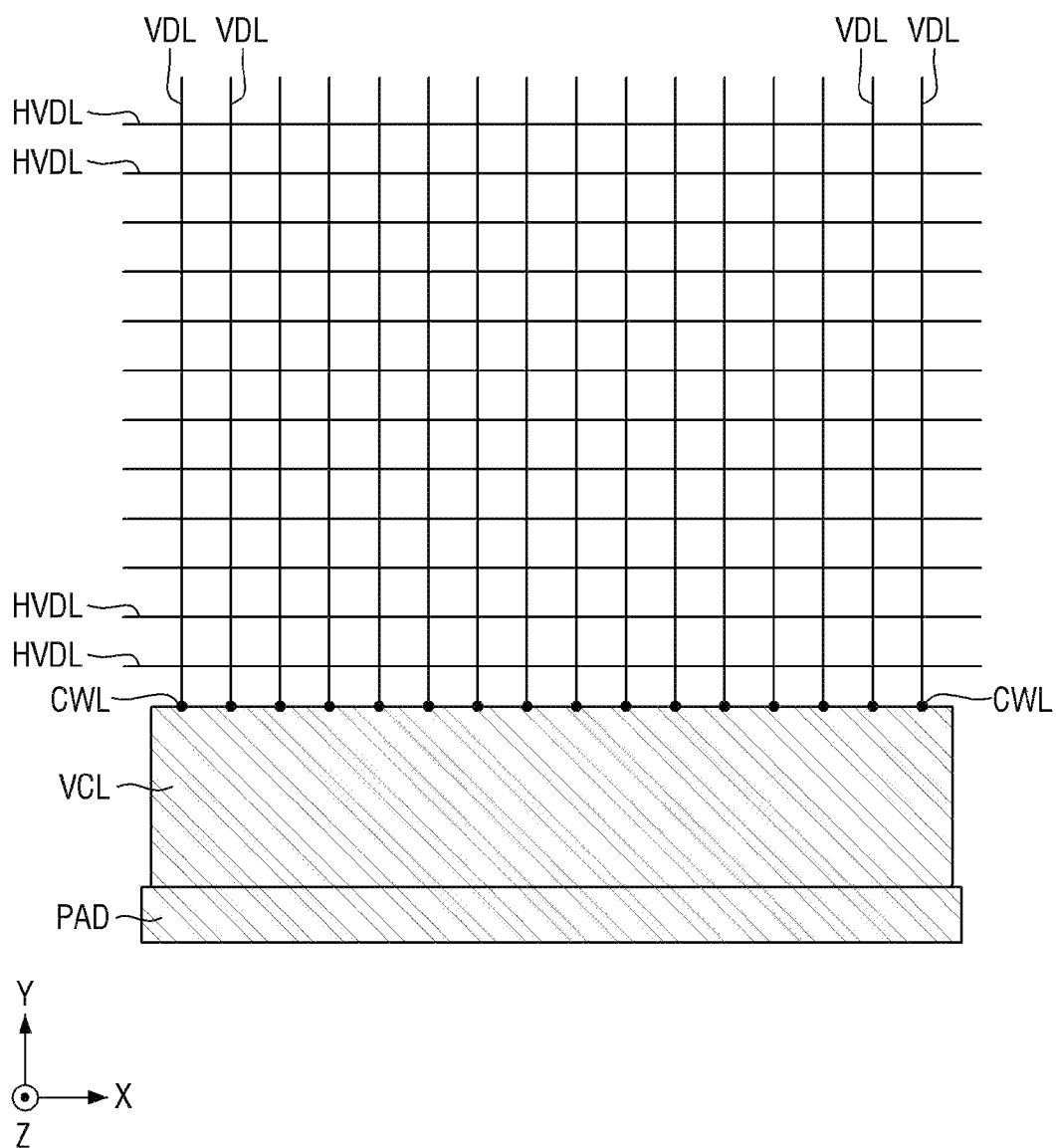
FIG. 7 is a schematic view illustrating the pad, a power connection line, high potential lines, and horizontal voltage lines in the display device according to an embodiment.
Figure 8:
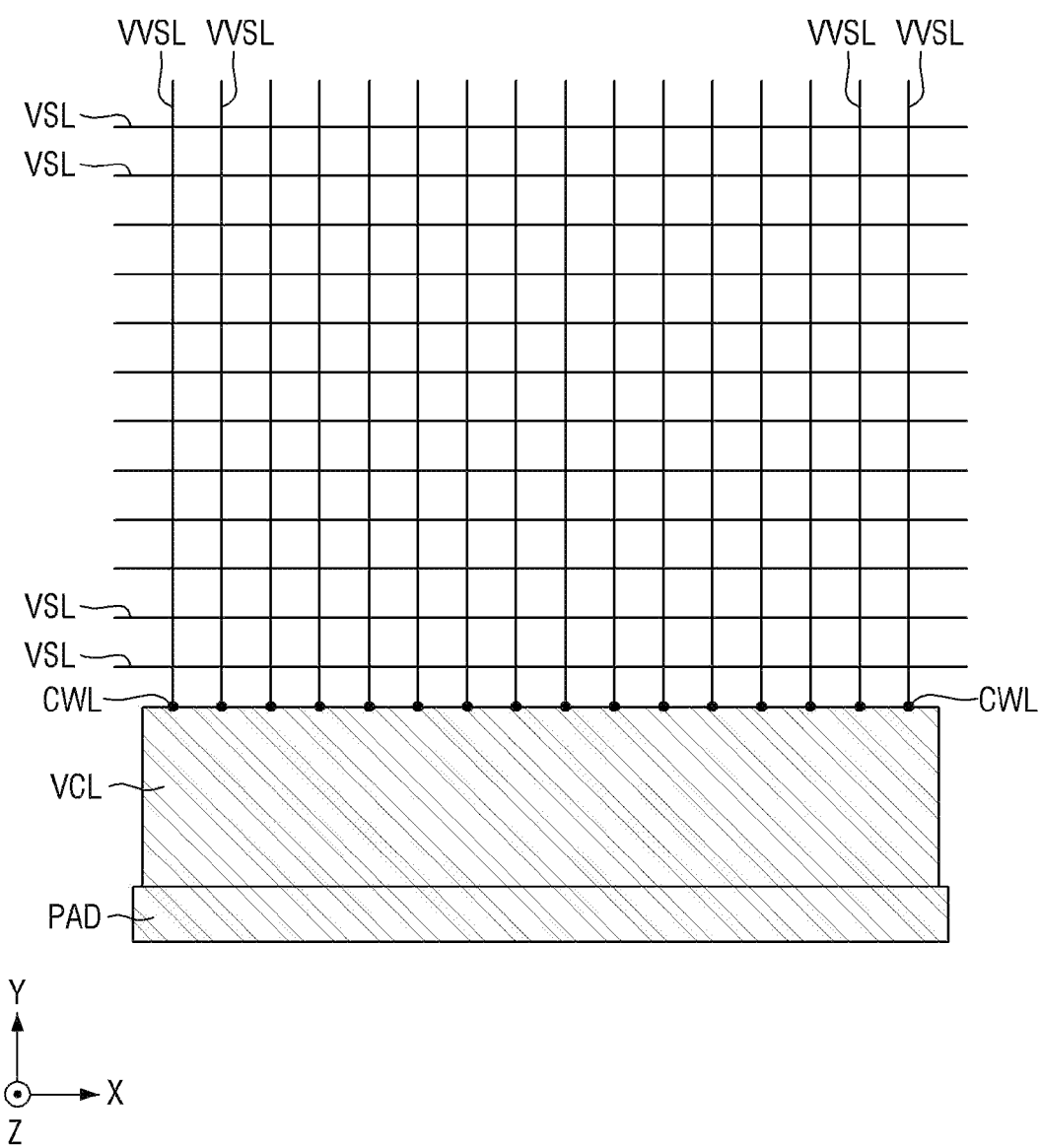
FIG. 8 is a schematic view illustrating the pad, the power connection line, low potential lines, and vertical voltage lines in the display device according to an embodiment.
Figure 9:
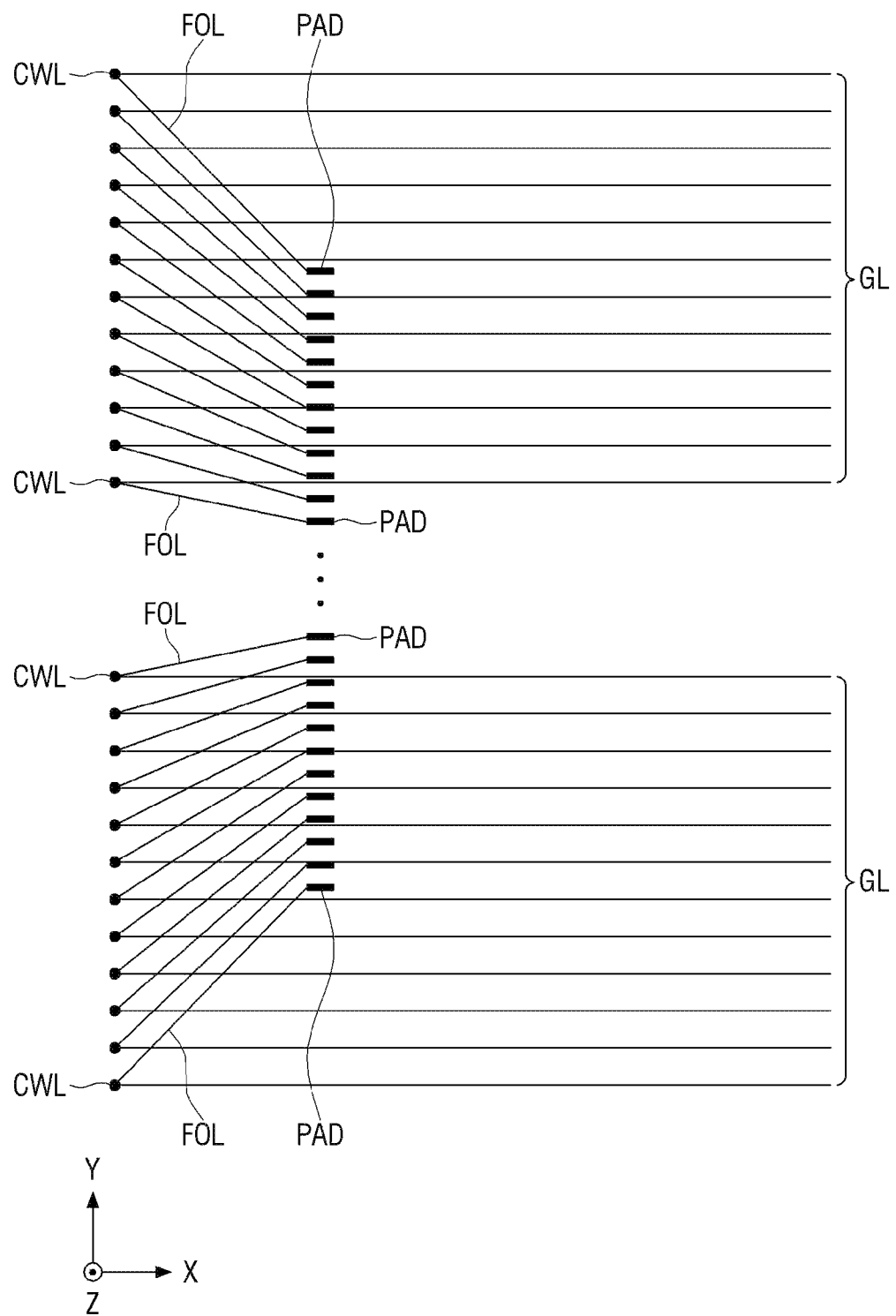
FIG. 9 is a schematic view illustrating the pads, the fan-out lines, and gate lines in the display device according to an embodiment.

FIG. 6 is a schematic view illustrating pads, fan-out lines, sensing lines, and data lines in the display device according to an embodiment, and FIG. 7 is a schematic view illustrating the pad, a power connection line, high potential lines, and horizontal voltage lines in the display device according to an embodiment. FIG. 8 is a schematic view illustrating the pad, the power connection line, low potential lines, and vertical voltage lines in the display device according to an embodiment, and FIG. 9 is a schematic view illustrating the pads, the fan-out lines, and gate lines in the display device according to an embodiment.

Referring to FIGS. 6 to 9, the display area DA may include sensing lines SL, data lines DL, high potential lines VDL, horizontal voltage lines HVDL, low potential lines VSL, vertical voltage lines VVSL, and gate lines GL.

Multiple sensing lines SL may extend in the second direction (Y-axis direction) and may be spaced apart from each other in the first direction (X-axis direction). Referring to FIG. 2, the sensing line SL may be disposed at the second metal layer MTL2 and extend in the second direction (Y-axis direction). The sensing line SL may be electrically connected to the fan-out line FOL of the first metal layer MTL1 through the connector CWL. The sensing line SL may cross the fan-out line FOL in a plan view. The sensing line SL may receive an initialization voltage through the pad PAD. The sensing line SL may provide a sensing signal to the pad PAD.

The data line DL may include first to third data lines DL1, DL2, and DL3. The first to third data lines DL1, DL2, and DL3 may extend in the second direction (Y-axis direction) and may be spaced apart from each other in the first direction (X-axis direction). Referring to FIG. 2, the data line DL may be disposed at the second metal layer MTL2 and extend in the second direction (Y-axis direction). The data line DL may be electrically connected to the fan-out line FOL of the first metal layer MTL1 through the connector CWL. The data line DL may cross the fan-out line FOL in a plan view. The data line DL may receive the data voltage through the pad PAD.

Multiple high potential lines VDL may extend in the second direction (Y-axis direction) and may be spaced apart from each other in the first direction (X-axis direction). The high potential lines VDL may be electrically connected to the horizontal voltage lines HVDL crossing the high potential lines VDL, and may supply high potential voltages to the horizontal voltage lines HVDL. Referring to FIG. 2, the high potential line VDL may be disposed at the second metal layer MTL2 and extend in the second direction (Y-axis direction). The high potential line VDL may be electrically connected to a power connection line VCL of the first metal layer MTL1 through the connector CWL. The high potential line VDL may receive the high potential voltage through the pad PAD.

Multiple horizontal voltage lines HVDL may extend in the first direction (X-axis direction) and may be spaced apart from each other in the second direction (Y-axis direction). The horizontal voltage lines HVDL may be electrically connected to the high potential lines VDL crossing the horizontal voltage lines HVDL, and may receive the high potential voltages from the high potential lines VDL. Referring to FIG. 2, the horizontal voltage line HVDL may be disposed at the fourth metal layer MTL4 and extend in the first direction (X-axis direction).

Multiple vertical voltage lines VVSL may extend in the second direction (Y-axis direction) and may be spaced apart from each other in the first direction (X-axis direction). The vertical voltage lines VVSL may be electrically connected to the low potential lines VSL crossing the vertical voltage lines VVSL, and may supply low potential voltages to the low potential lines VSL. Referring to FIG. 2, the vertical voltage line VVSL may be disposed at the second metal layer MTL2 and extend in the second direction (Y-axis direction). The vertical voltage line VVSL may be electrically connected to the power connection line VCL of the first metal layer MTL1 through the connector CWL. The vertical voltage line VVSL may receive the low potential voltage through the pad PAD.

Multiple low potential lines VSL may extend in the first direction (X-axis direction) and may be spaced apart from each other in the second direction (Y-axis direction). The low potential lines VSL may be electrically connected to the vertical voltage lines VVSL crossing the low potential lines VSL, and may receive the low potential voltages from the vertical voltage lines VVSL. Referring to FIG. 2, the low potential line VSL may be disposed at the fourth metal layer MTL4 and extend in the first direction (X-axis direction).

Multiple gate lines GL may extend in the first direction (X-axis direction) and may be spaced apart from each other in the second direction (Y-axis direction). Referring to FIG. 2, the gate line GL may be disposed at the third metal layer MTL3 or the fourth metal layer MTL4 and extend in the first direction (X-axis direction). The gate line GL may be electrically connected to the fan-out line FOL of the first metal layer MTL1 through the connector CWL. The gate line GL may cross the fan-out line FOL in a plan view. The gate line GL may receive the gate signal through the pad PAD.

Figure 10:
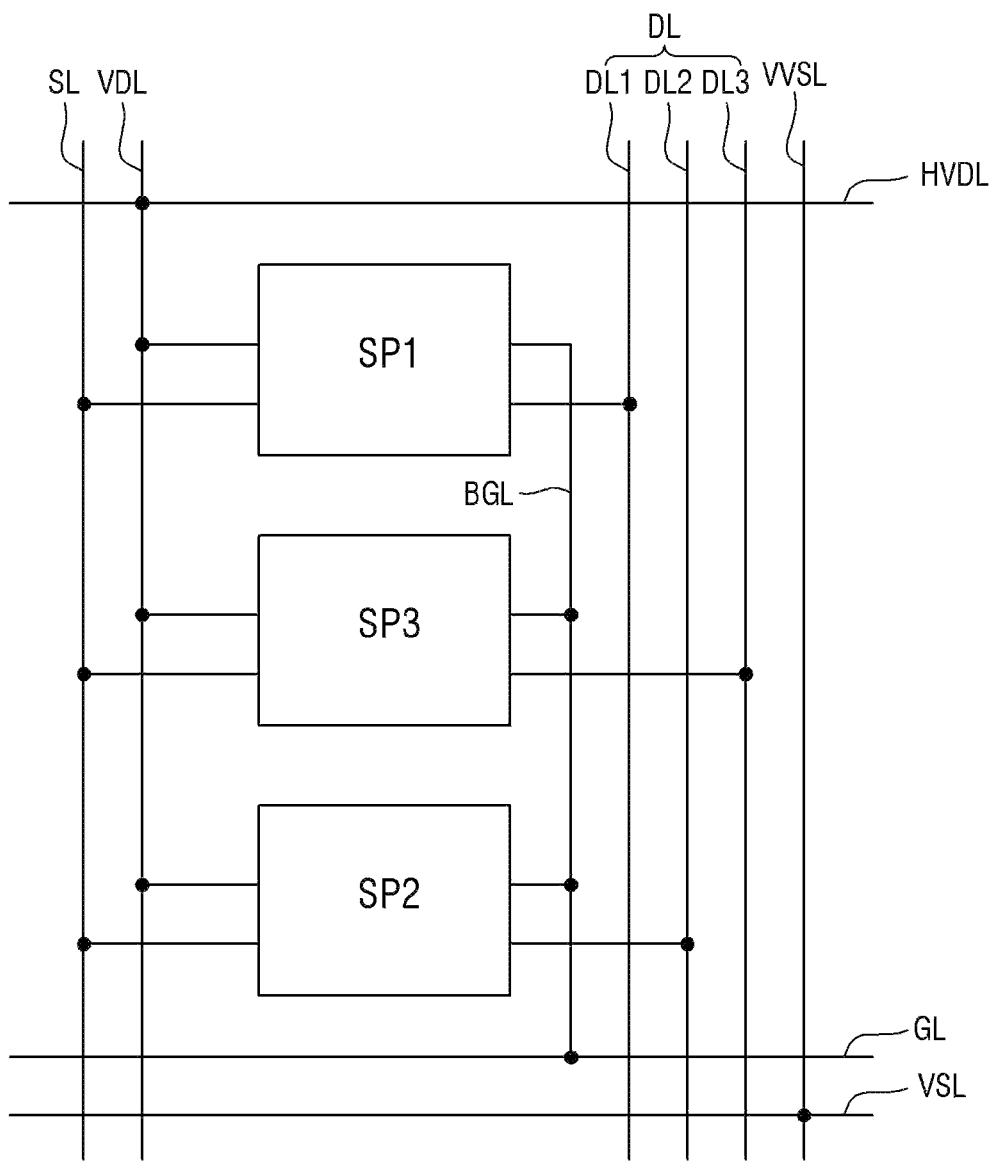
FIG. 10 is a schematic block diagram illustrating pixels and lines of the display device according to an embodiment.
Figure 11:
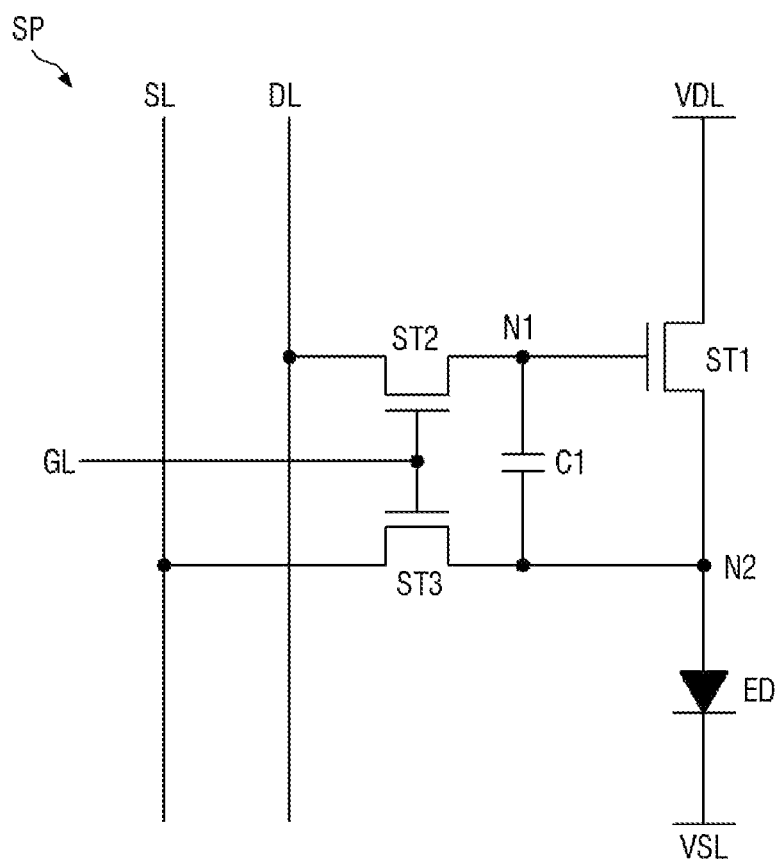
FIG. 11 is a schematic diagram of an equivalent circuit of the pixel of FIG. 10.

FIG. 10 is a schematic block diagram illustrating pixels and lines of the display device according to an embodiment, and FIG. 11 is a schematic diagram of an equivalent circuit of the pixel of FIG. 10.

Referring to FIGS. 10 and 11, the pixels SP may include first to third pixels SP1, SP2, and SP3. A pixel circuit of the first pixel SP1, a pixel circuit of the third pixel SP3, and a pixel circuit of the second pixel SP2 may be arranged in a direction opposite to the second direction (Y-axis direction), but the order and arrangement of the pixel circuits is not limited thereto.

Each of the first to third pixels SP1, SP2, and SP3 may be electrically connected to the high potential line VDL, the sensing line SL, the gate line GL, and the data line DL.

The high potential line VDL may extend in the second direction (Y-axis direction). The high potential line VDL may be disposed on the left side of the pixel circuits of the first to third pixels SP1, SP2, and SP3. The high potential line VDL may supply a high potential voltage to a transistor of each of the first to third pixels SP1, SP2, and SP3.

The horizontal voltage line HVDL may extend in the first direction (X-axis direction). The horizontal voltage line HVDL may be disposed on the upper side of the pixel circuit of the first pixel SP1. The horizontal voltage line HVDL may be electrically connected to the high potential line VDL. The horizontal voltage line HVDL may receive a high potential voltage from the high potential line VDL.

The sensing line SL may extend in the second direction (Y-axis direction). The sensing line SL may be disposed on the left side of the high potential line VDL. The sensing line SL may supply an initialization voltage to the pixel circuit of each of the first to third pixels SP1, SP2, and SP3. The sensing line SL may receive a sensing signal from each of the pixel circuits of the first to third pixels SP1, SP2, and SP3 and supply the sensing signal to the display driver DIC.

The gate line GL may extend in the first direction (X-axis direction). Referring to FIG. 2, the gate line GL may be disposed at the third metal layer MTL3 or the fourth metal layer MTL4. The gate line GL may be disposed on the lower side of the pixel circuit of the second pixel SP2. The gate line GL may be disposed on the upper side of the low potential line VSL. The gate line GL may supply a gate signal to an auxiliary gate line BGL.

The auxiliary gate line BGL may extend in the second direction (Y-axis direction) from the gate line GL. Referring to FIG. 2, the auxiliary gate line BGL may be disposed at the third metal layer MTL3. A portion of the auxiliary gate line BGL may be a gate electrode GE of a second transistor ST2, and another portion of the auxiliary gate line BGL may be a gate electrode GE of a third transistor ST3. The auxiliary gate line BGL may be disposed on the right side of the pixel circuits of the first to third pixels SP1, SP2, and SP3. The auxiliary gate line BGL may supply the gate signal received from the gate line GL to the pixel circuits of the first to third pixels SP1, SP2, and SP3.

The data line DL may extend in the second direction (Y-axis direction). The data line DL may supply a data voltage to the pixel SP. The data line DL may include first to third data lines DL1, DL2, and DL3.

The first data line DL1 may extend in the second direction (Y-axis direction). The first data line DL1 may be disposed on the right side of the auxiliary gate line BGL. The first data line DL1 may supply the data voltage received from the display driver DIC to the pixel circuit of the first pixel SP1.

The second data line DL2 may extend in the second direction (Y-axis direction). The second data line DL2 may be disposed on the right side of the first data line DL1. The second data line DL2 may supply the data voltage received from the display driver DIC to the pixel circuit of the second pixel SP2.

The third data line DL3 may extend in the second direction (Y-axis direction). The third data line DL3 may be disposed on the right side of the second data line DL2. The third data line DL3 may supply the data voltage received from the display driver DIC to the pixel circuit of the third pixel SP3.

The vertical voltage line VVSL may extend in the second direction (Y-axis direction). The vertical voltage line VVSL may be disposed on the right side of the third data line DL3. The vertical voltage line VVSL may be electrically connected to the low potential line VSL, and may supply a low potential voltage to the low potential line VSL.

The low potential line VSL may extend in the first direction (X-axis direction). The low potential line VSL may be disposed on the lower side of the gate line GL in a plan view. The low potential line VSL may supply the low potential voltage received from the vertical voltage line VVSL to light emitting elements ED of the first to third pixels SP1, SP2, and SP3.

Each of the first to third pixels SP1, SP2, and SP3 may include a pixel circuit and a light emitting element ED. The pixel circuit of each of the first to third pixels SP1, SP2, and SP3 may include first to third transistors ST1, ST2, and ST3 and a first capacitor C1.

The first transistor ST1 may include a gate electrode, a drain electrode, and a source electrode. The gate electrode of the first transistor ST1 may be electrically connected to a first node N1, the drain electrode of the first transistor ST1 may be electrically connected to the high potential line VDL, and the source electrode of the first transistor ST1 may be electrically connected to a second node N2. The first transistor ST1 may control a drain-source current (or a driving current) based on a data voltage applied to the gate electrode.

The light emitting element ED may include at least one light emitting element ED. In case that the light emitting element ED includes multiple light emitting elements ED, the light emitting elements ED may be electrically connected to each other in series or in parallel. The light emitting element ED may receive the driving current from the first transistor ST1 to emit light. A light emission amount or luminance of the light emitting element ED may be proportional to a magnitude of the driving current. The light emitting element ED may be an inorganic light emitting element including an inorganic semiconductor, but is not limited thereto.

A first electrode of the light emitting element ED may be electrically connected to the second node N2, and a second electrode of the light emitting element ED may be electrically connected to the low potential line VSL. The first electrode of the light emitting element ED may be electrically connected to the source electrode of the first transistor ST1, a drain electrode of the third transistor ST3, and a second capacitor electrode of the first capacitor C1 through the second node N2.

The second transistor ST2 may be turned on by a gate signal of the gate line GL to electrically connect the data line DL and the first node N1, which is the gate electrode of the first transistor ST1, to each other. The second transistor ST2 may be turned on in response to the gate signal to supply a data voltage to the first node N1. A gate electrode of the second transistor ST2 may be electrically connected to the gate line GL, a drain electrode of the second transistor ST2 may be electrically connected to the data line DL, and a source electrode of the second transistor ST2 may be electrically connected to the first node N1.

The third transistor ST3 may be turned on by a gate signal of the gate line GL to electrically connect the sensing line SL and the second node N2, which is the source electrode of the first transistor ST1, to each other. The third transistor ST3 may be turned on in response to the gate signal to supply an initialization voltage to the second node N2 and supply a sensing signal to the sensing line SL. A gate electrode of the third transistor ST3 may be electrically connected to the gate line GL, the drain electrode of the third transistor ST3 may be electrically connected to the second node N2, and a source electrode of the third transistor ST3 may be electrically connected to the sensing line SL.

Figure 12:
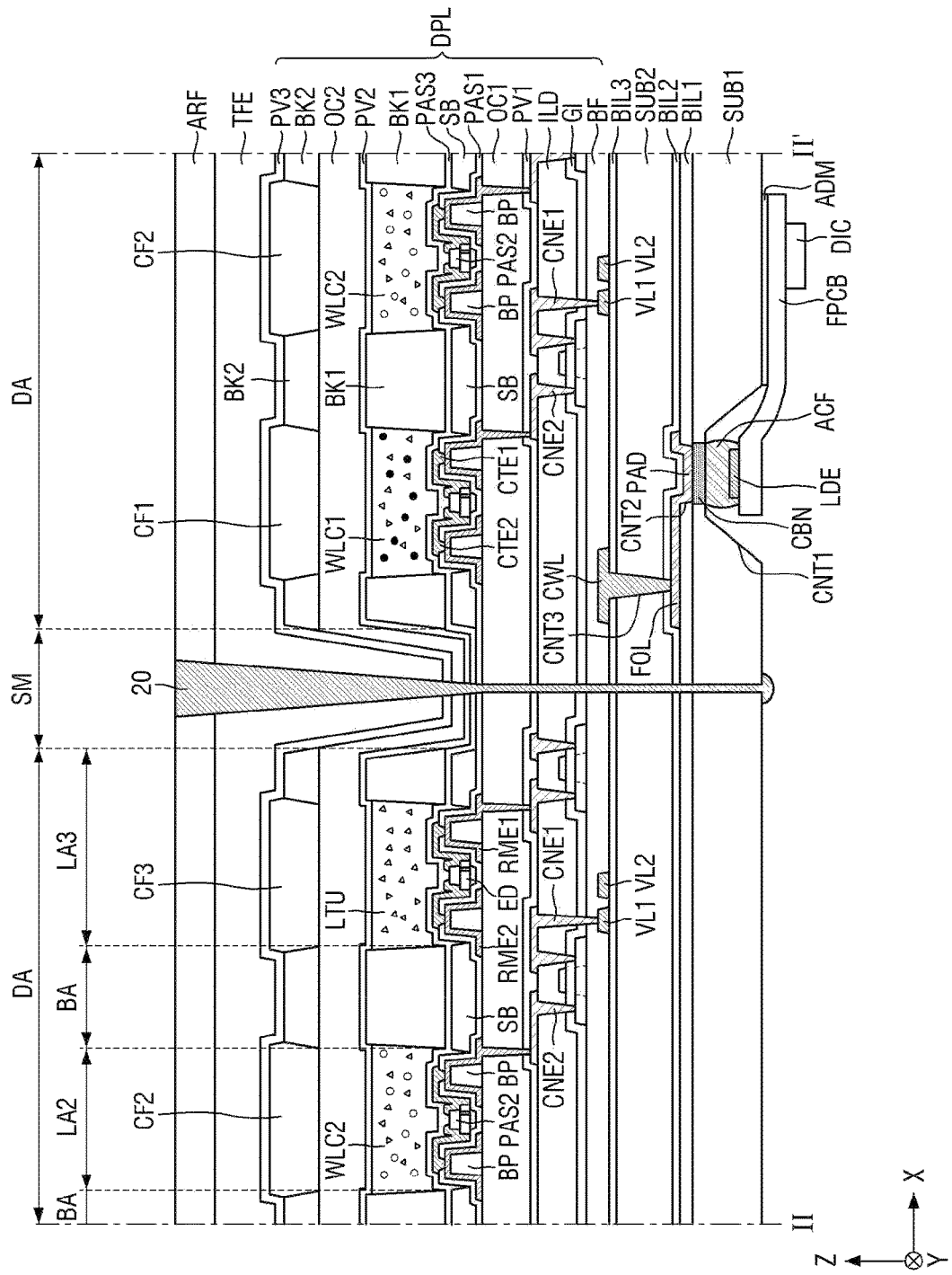
FIG. 12 is a schematic cross-sectional view taken along line II-IF of FIG. 1.

FIG. 12 is a schematic cross-sectional view taken along line II-IF of FIG. 1.

Referring to FIG. 12, the tiled display device TD may include multiple display devices 10 and connecting members 20. The tiled display device TD may include first to fourth display devices 10-1 to 10-4. The number of display devices 10 and a connection relationship between the display devices 10 are not limited to the embodiment of FIG. 1. The number of display devices 10 may be determined according to sizes of each of the display devices 10 and the tiled display device TD.

The display device 10 may include a display area DA and a non-display area NDA. The display area DA may include multiple pixels SP to display an image. The non-display area NDA may be disposed adjacent to the display area DA to surround the display area DA, and may not display an image.

The tiled display device TD may include connecting areas SM disposed between multiple display areas DA. The tiled display device TD may be formed by connecting the non-display areas NDA of adjacent display devices 10 to each other. The display devices 10 may be connected to each other by the connecting members 20 or adhesive members disposed in the connecting areas SM. The connecting areas SM of each of the display devices 10 may not include pads or fan-out lines electrically connected to the pads. Accordingly, a distance between the display areas DA of each of the display devices 10 may be too small for the connecting areas SM to be recognized by a user. An external light reflectivity of the display areas DA of each of the display devices 10 may be substantially the same as an external light reflectivity of the connecting areas SM. Accordingly, the tiled display device TD may prevent a sense of discontinuity between the display devices 10 and improve a degree of immersion of an image by preventing the connecting areas SM between the display devices 10 from being recognized by a user.

In the tiled display device TD, side surfaces of adjacent display devices 10 may be connected to each other using the connecting members 20 disposed between the display devices 10. The connecting members 20 may connect side surfaces of the first to fourth display devices 10-1 to 10-4 arranged in a lattice shape to each other to implement the tiled display device TD. The connecting members 20 may connect side surfaces of the first substrates SUB1, side surfaces of the first and second barrier insulating films BIL1 and BIL2, side surfaces of the second substrates SUB2, side surfaces of the third barrier insulating films BIL3, side surfaces of the display layers DPL, side surfaces of the encapsulation layers TFE, and side surfaces of the anti-reflection films ARF of the adjacent display devices 10 to each other.

In an embodiment, the connecting member 20 may be formed of an adhesive or a double-sided tape having a relatively small thickness to minimize an interval between the display devices 10. In another embodiment, the connecting member 20 may be formed of a connection frame having a relatively small thickness to minimize an interval between the display devices 10. Accordingly, the tiled display device TD may prevent the connecting areas SM between the display devices 10 from being recognized by a user.

FIGS. 13 to 20 are schematic cross-sectional views illustrating a process of manufacturing the display device according to an embodiment.

Figure 13:
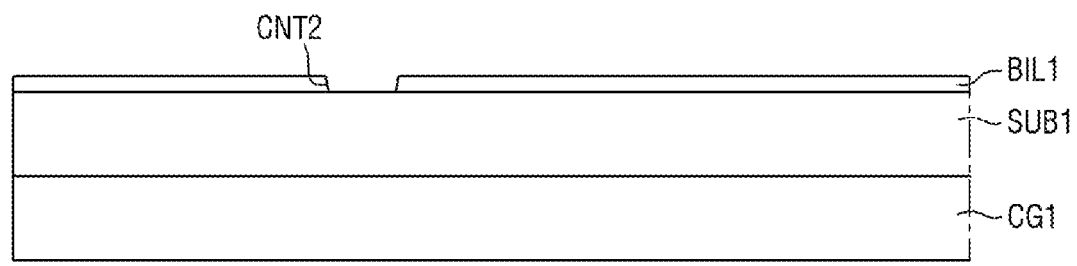
FIGS. 13 to 20 are schematic cross-sectional views illustrating a process of manufacturing the display device according to an embodiment.

In FIG. 13, a first carrier substrate CG1 may support the display device 10 in the process of manufacturing the display device 10. For example, the first carrier substrate CG1 may be a carrier glass, but is not limited thereto.

The first substrate SUB1 may be disposed on the first carrier substrate CG1. The first substrate SUB1 may be a base substrate or a base member. For example, the first substrate SUB1 may include an insulating material such as a polymer resin, for example, polyimide PI, but is not limited thereto.

The first barrier insulating film BIL1 may be disposed on the first substrate SUB1. The first barrier insulating film BIL1 may include an inorganic film capable of preventing penetration of air or moisture. The first barrier insulating film BIL1 may include a second contact hole CNT2. The second contact hole CNT2 may be etched from an upper surface of the first barrier insulating film BIL1 to penetrate to a lower surface of the first barrier insulating film BILL The second contact hole CNT2 may expose a portion of the first substrate SUB1. For example, a width of an upper portion of the second contact hole CNT2 may be greater than a width of a lower portion of the second contact hole CNT2.

Figure 14:
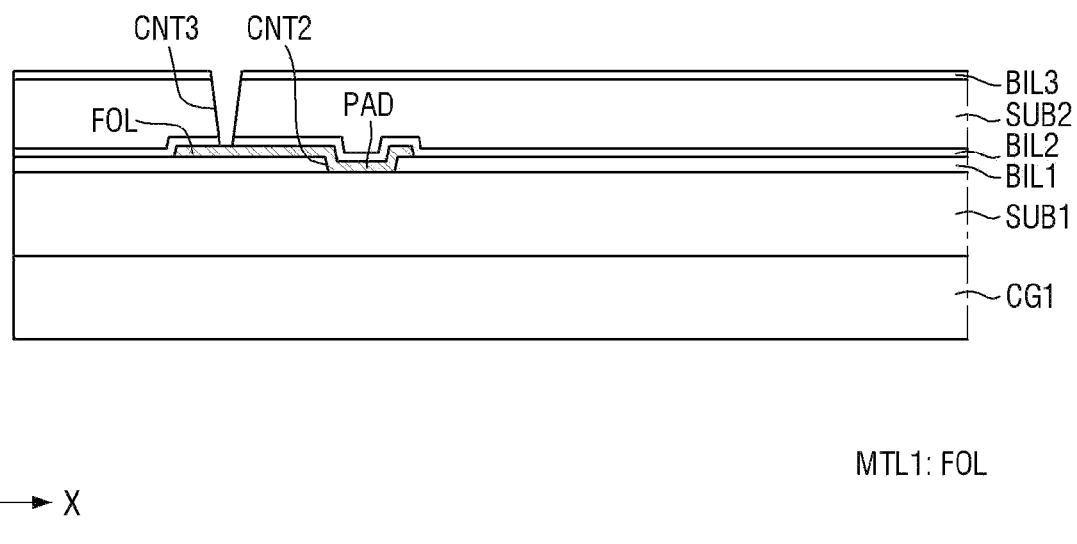

In FIG. 14, the first metal layer MTL1 may be disposed on the first barrier insulating film BILL The first metal layer MTL1 may include a fan-out line FOL. The pad PAD may be integral with the fan-out line FOL and inserted into the second contact hole CNT2. The first metal layer MTL1 may be formed as a single layer or multiple layers including at least one of molybdenum (Mo), aluminum (Al), chromium (Cr), gold (Au), silver (Ag), titanium (Ti), nickel (Ni), palladium (Pd), indium (In), neodymium (Nd), and copper (Cu).

The second barrier insulating film BIL2 may be disposed on the first barrier insulating film BIL1 and the fan-out line FOL. The second barrier insulating film BIL2 may include an inorganic film capable of preventing penetration of air or moisture.

The second substrate SUB2 and the third barrier insulating film BIL3 may be sequentially disposed on the second barrier insulating film BIL2. The third contact hole CNT3 may be etched from an upper surface of the third barrier insulating film BIL3 to penetrate to a lower surface of the second barrier insulating film BIL2. For example, the second and third barrier insulating films BIL2 and BIL3 and the second substrate SUB2 may be penetrated by a dry etching process or a wet etching process, but are not limited thereto. An upper surface of the fan-out line FOL may be exposed by the third contact hole CNT3.

Figure 15:
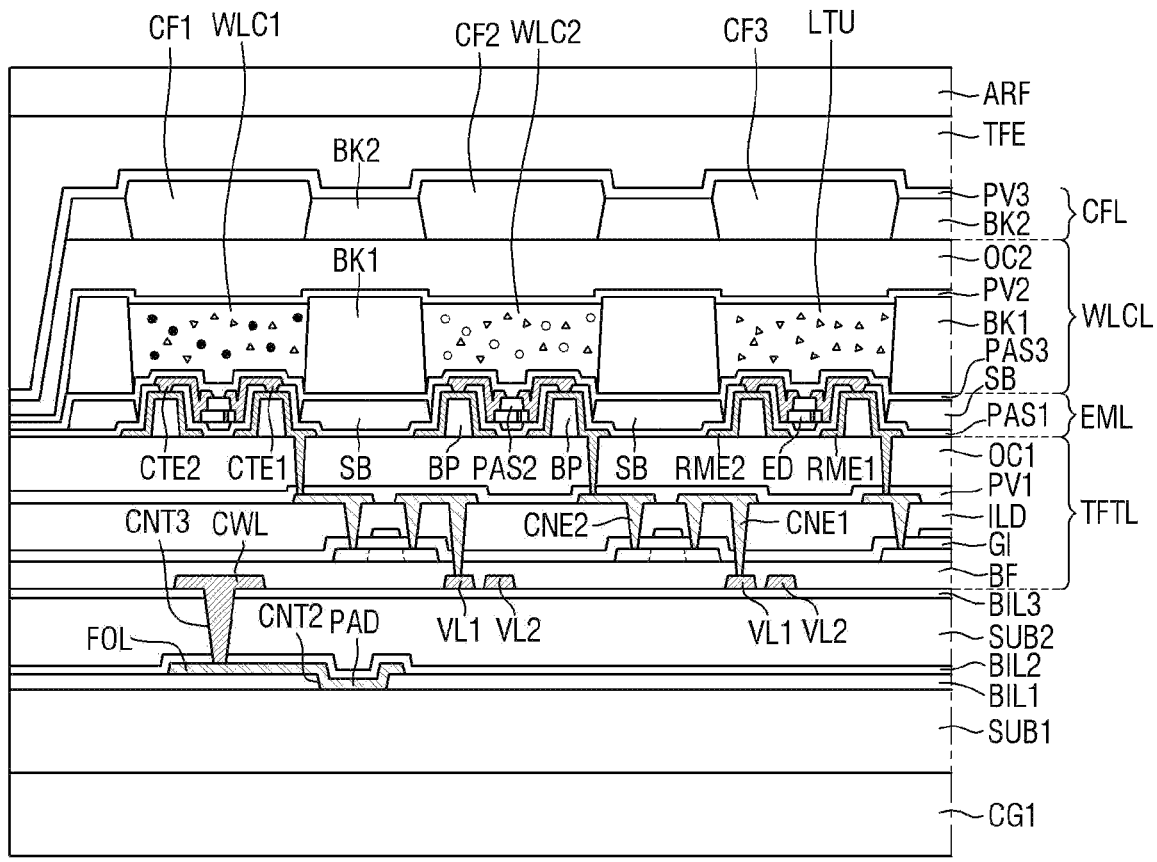

In FIG. 15, the display layer DPL may be disposed on the third barrier insulating film BIL3. The thin film transistor layer TFTL, the light emitting element layer EML, the wavelength conversion layer WLCL, and the color filter layer CFL may be sequentially disposed on the third barrier insulating film BIL3. The encapsulation layer TFE may cover an upper surface and side surfaces of the display layer DPL. The anti-reflection film ARF may be formed on the encapsulation layer TFE.

Figure 16:
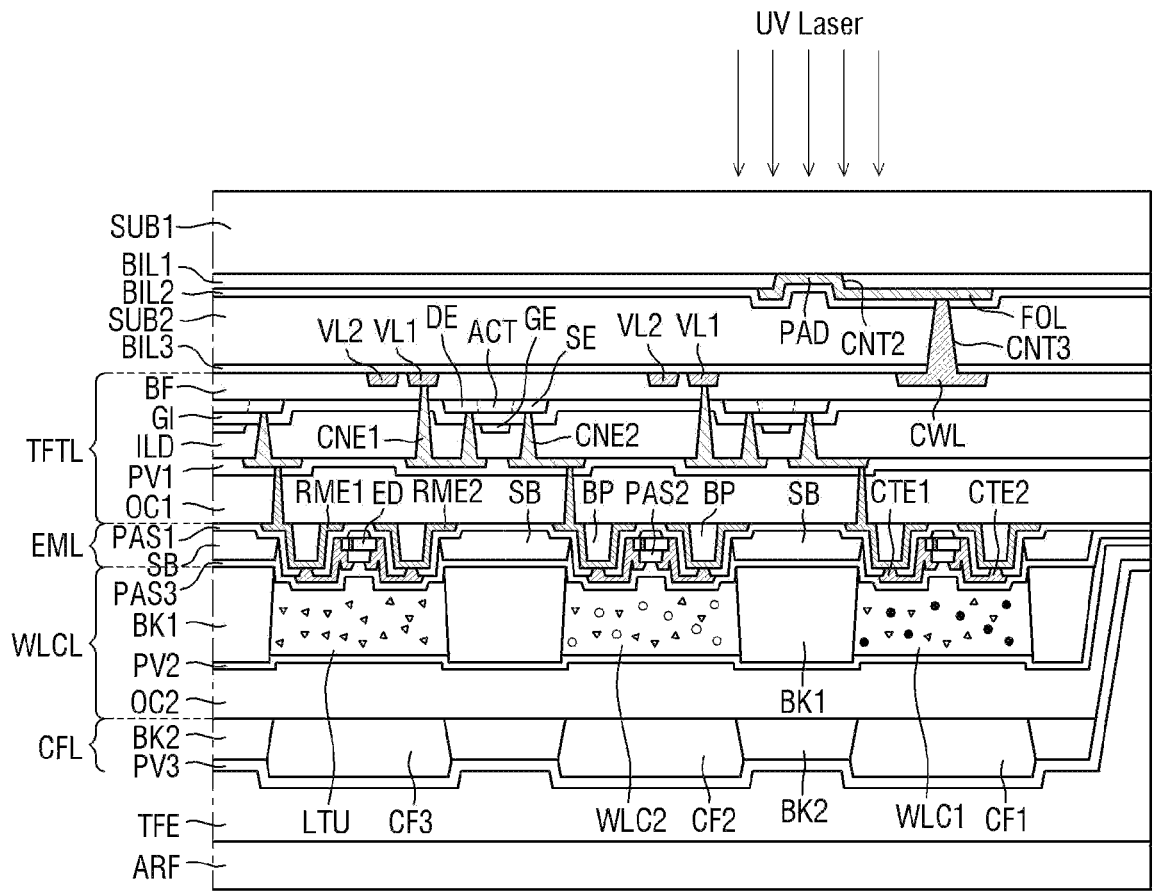
Figure 17:
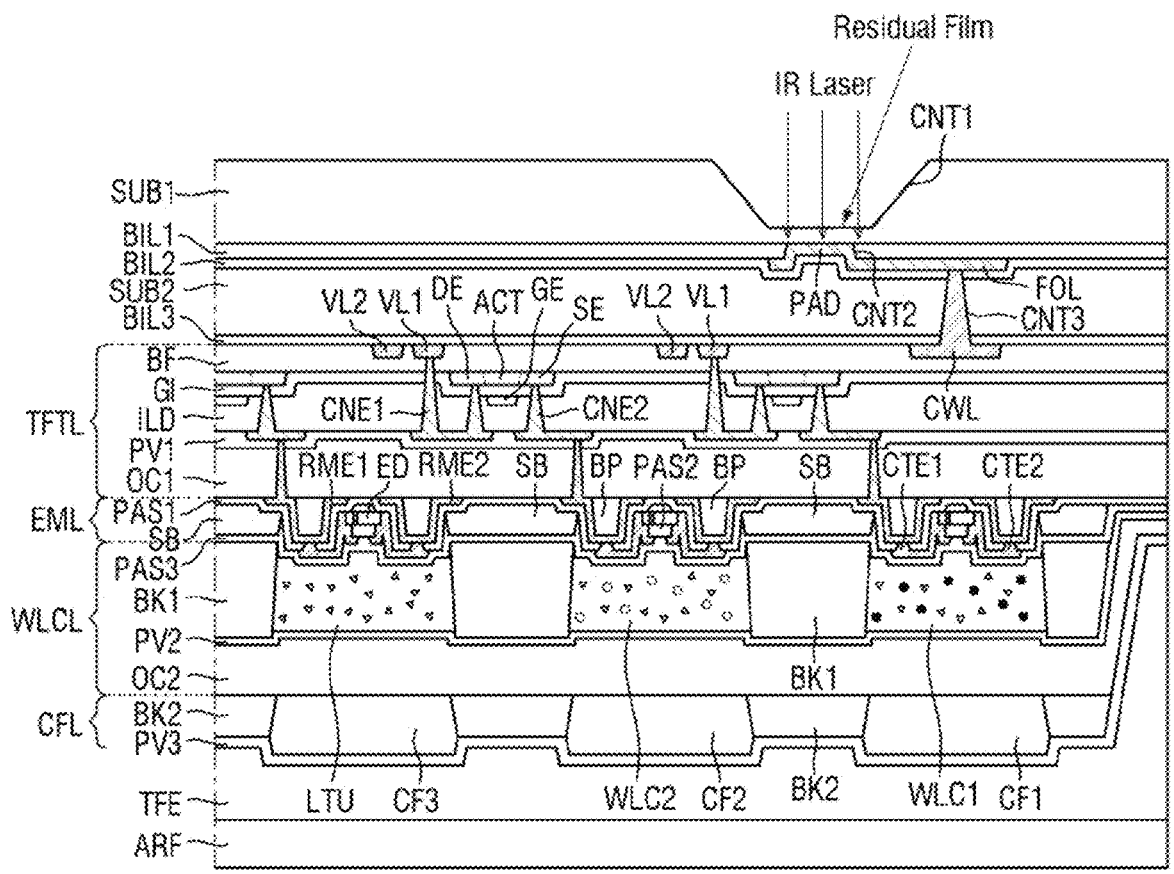
Figure 18:
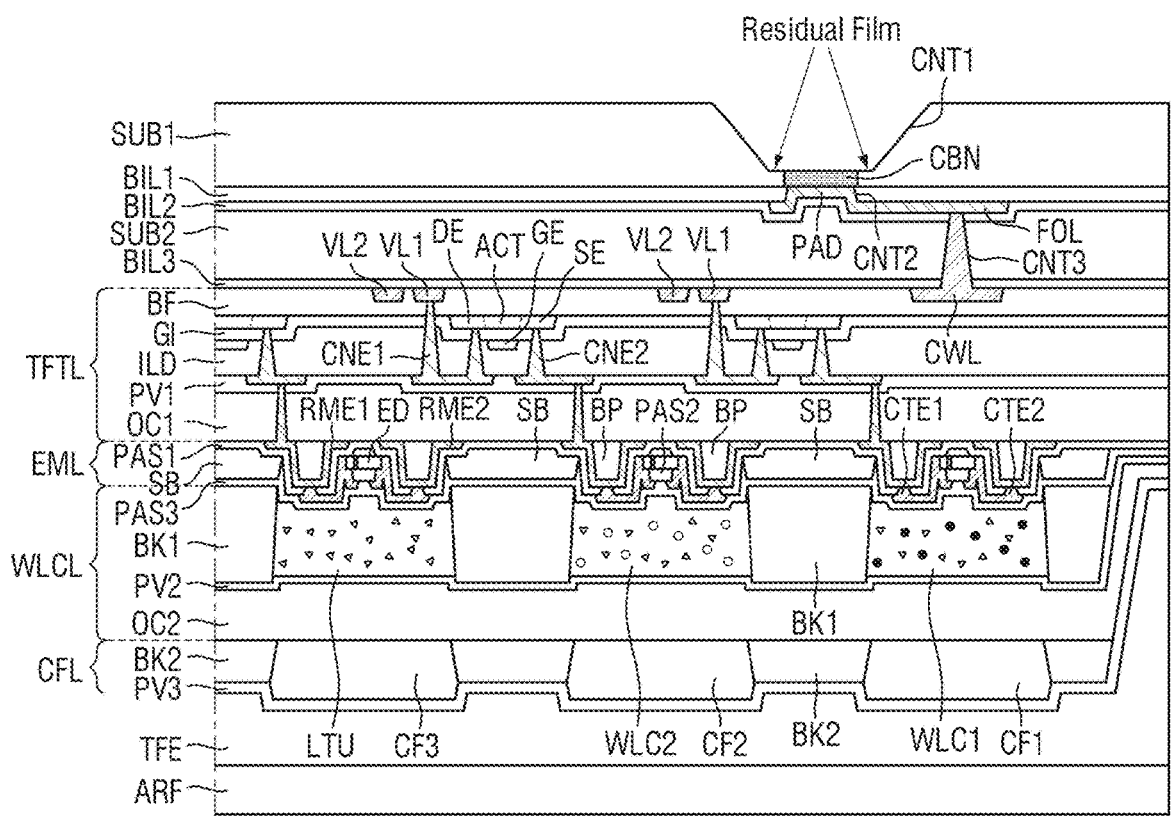

In FIGS. 16 to 18, the display device 10 that is being manufactured may be rotated in order to attach the flexible film FPCB. The first carrier substrate CG1 may be removed from the first substrate SUB1. For example, the first carrier substrate CG1 may be removed from a lower surface of the first substrate SUB1 using a sacrificial layer (not illustrated) disposed between the first carrier substrate CG1 and the first substrate SUB1, but is not limited thereto.

A second carrier substrate (not shown) may be disposed on a surface of the anti-reflection film ARF. The second carrier substrate (not shown) may support the display device 10 in the rotated state. For example, the second carrier substrate (not shown) may be a carrier glass, but is not limited thereto.

The first contact hole CNT1 may be formed on a surface of the first substrate SUB1 by an etching process using an ultraviolet laser beam. The first contact hole CNT1 may be formed so that a residual film of the first substrate SUB1 remains. The first contact hole CNT1 may be etched from a surface of the first substrate SUB1 to penetrate to the residual film of the first substrate SUB1. For example, the first substrate SUB1 may be irradiated with an ultraviolet laser beam having a picosecond pulse, such that the residual layer remains. The ultraviolet laser beam may have a wavelength of about 300 to about 400 nm, or a wavelength of about 340 to about 350 nm. The residual film of the first substrate SUB1 may prevent damage to the pad PAD in the etching process of the first substrate SUB1.

For example, a second thickness T2 of the residual film of the first substrate SUB1 may be about 1/20 to about 1/5, or about 1/10, of a first thickness T1 of the first substrate SUB1, but is not limited thereto. In case that the first thickness T1 of the first substrate SUB1 is about 10 μm, the second thickness T2 of the residual film of the first substrate SUB1 may be about 1 μm. In another embodiment, the first thickness T1 of the first substrate SUB1 may be about 5 to about 20 μm, and the second thickness T2 of the residual film of the first substrate SUB1 may be about 0.5 to about 2 μm.

The residual film of the first substrate SUB1 may be irradiated with an infrared laser beam, such that the electric conductor CBN may be formed. The electric conductor CBN may have conductivity and may be in contact with the pad PAD. The electric conductor CBN may be formed by carbonizing the residual film of the first substrate SUB1. For example, the residual film of the first substrate SUB1 may be irradiated with an infrared laser beam having a femtosecond pulse to be micro-carbonized, such that the electric conductor CBN may be formed. The pulse of the infrared laser beam may be several femtoseconds to several picoseconds. Accordingly, the first contact hole CNT1 may expose the electric conductor CBN in the residual film of the first substrate SUB1.

Accordingly, since the display device 10 includes the electric conductor CBN in the residual film of the first substrate SUB1, a separate etching process for etching the residual film of the first substrate SUB1 may be omitted, and a process time and a manufacturing cost may be reduced.

Figure 19:
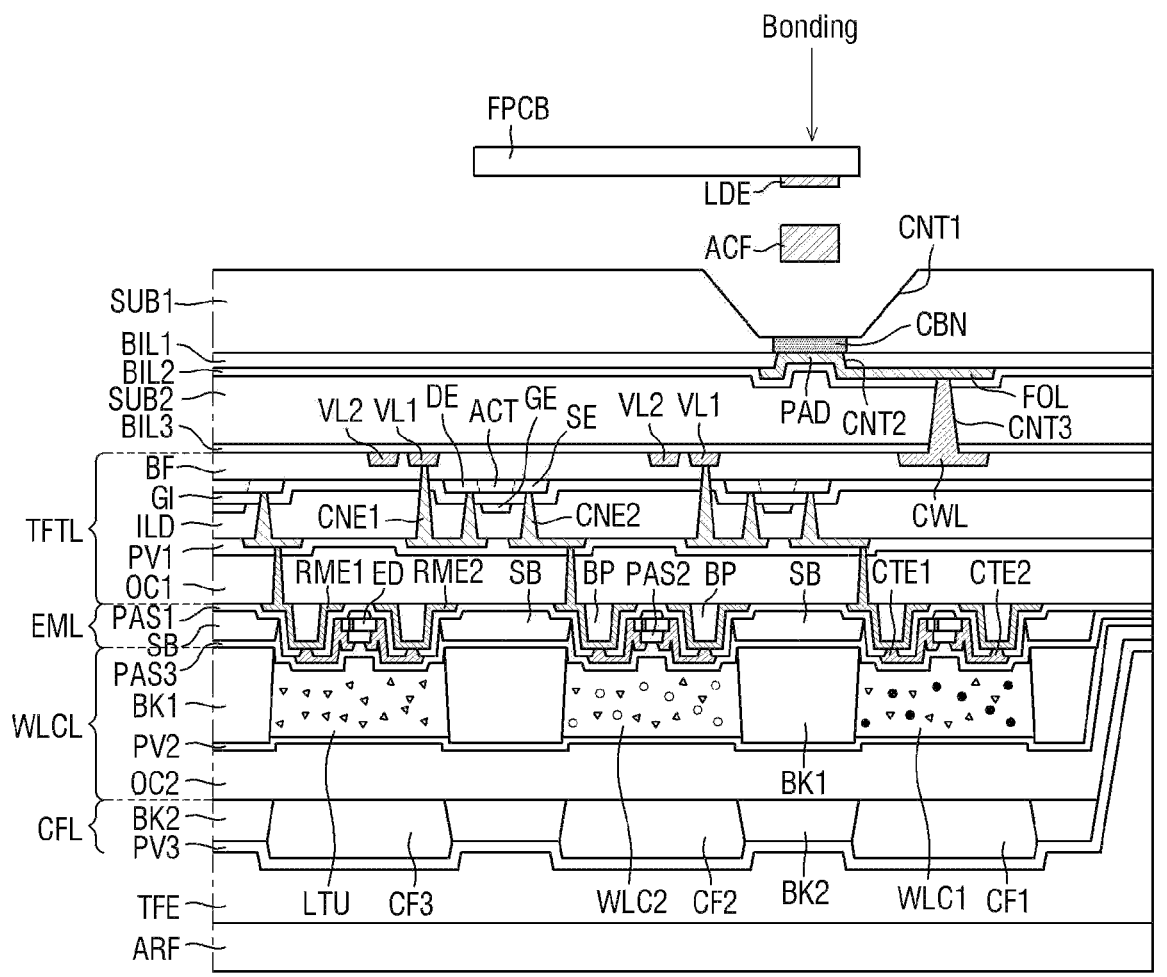
Figure 20:
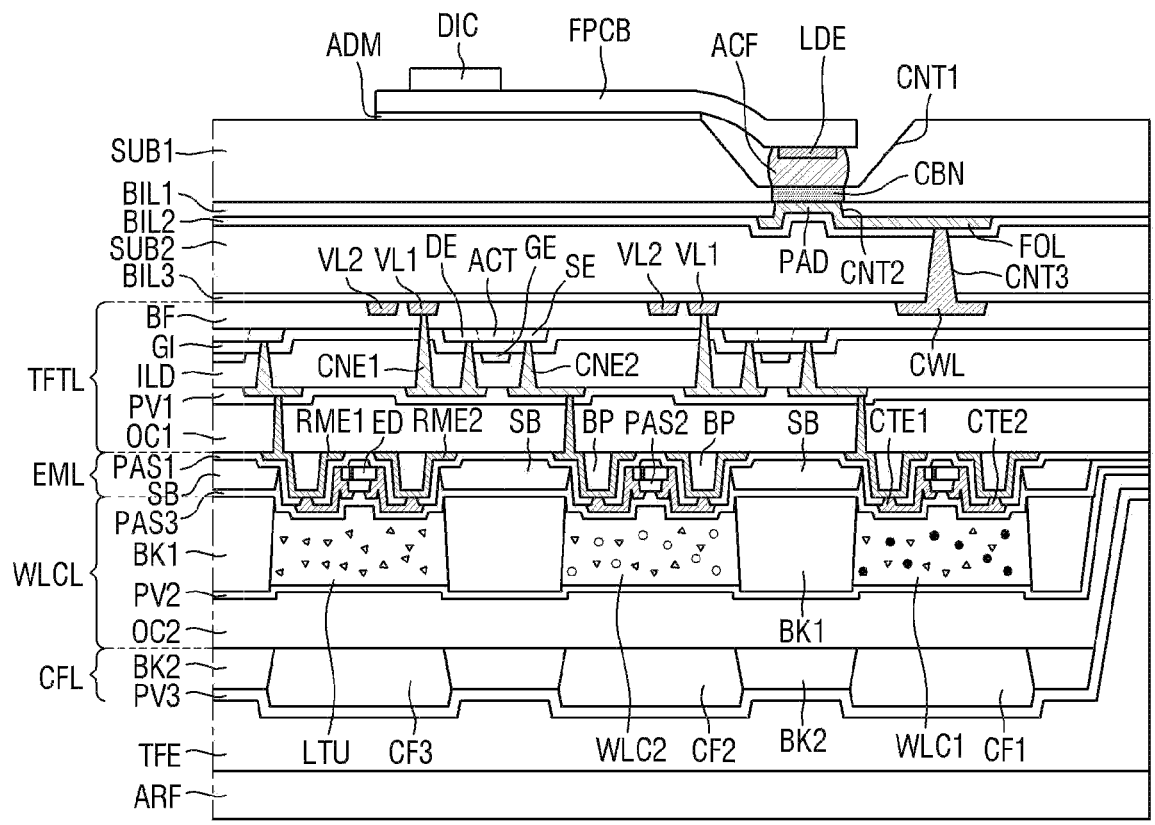

In FIGS. 19 and 20, the flexible film FPCB may be disposed on a surface of the first substrate SUB1. The flexible film FPCB and the lead electrode LDE may be aligned on the electric conductor CBN through an alignment process. For example, the lead electrode LDE of the flexible film FPCB may be attached to the electric conductor CBN through ultrasonic bonding or thermocompression bonding, but a bonding method is not limited thereto. The connection film ACF may have conductivity, and may electrically connect the flexible film FPCB to the pad PAD.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
   a substrate including a first contact hole and a residual film of the substrate, wherein the residual film of the substrate and the first contact hole overlap each other in a thickness direction;
   an electric conductor provided in the residual film and having conductivity;
   a first barrier insulating film disposed on the substrate and including a second contact hole;
   a fan-out line disposed in a first metal layer on the first barrier insulating film and including a pad disposed in the second contact hole, the pad electrically contacting the electric conductor;
   a display layer disposed on the fan-out line; and
   a flexible film disposed below the substrate, extending to the first contact hole, and electrically connected to the pad through the electric conductor.

2. The display device of claim 1, wherein
   the substrate includes an organic insulating material, and
   the electric conductor is formed by micro-carbonizing the residual film.

3. The display device of claim 1, wherein the electric conductor is formed by irradiating the residual film with infrared laser beam having a femtosecond pulse to micro-carbonize the residual film.

4. The display device of claim 1, wherein a thickness of the residual film is in a range of about 1/20 to about 1/5 of a thickness of the substrate.

5. The display device of claim 1, wherein
a thickness of the substrate is in a range of about 5 μm to about 20 μm, and
a thickness of the residual film is in a range of about 0.5 μm to about 2 μm.

6. The display device of claim 1, further comprising a connection film disposed between the electric conductor and the flexible film and electrically connecting the electric conductor and the flexible film.

7. The display device of claim 1, wherein the display layer includes:
a connector disposed in a second metal layer on the first metal layer and electrically connected to the fan-out line;
a data line disposed in the second metal layer and extending in a first direction; and
a high potential line disposed in the second metal layer and extending in the first direction.

8. The display device of claim 7, wherein
the pad supplies a data voltage to the data line through the connector, and
the pad supplies a high potential voltage to the high potential line through the connector.

9. The display device of claim 7, wherein
the display layer further includes:
a thin film transistor disposed in an active layer and a third metal layer on the second metal layer; and
a connection electrode disposed in a fourth metal layer on the third metal layer,
an end of the connection electrode is electrically connected to the high potential line, and
another end of the connection electrode is electrically connected to the thin film transistor.

10. The display device of claim 9, wherein
the display layer further includes a light emitting element layer disposed on the fourth metal layer, and
the light emitting element layer includes:
a first electrode electrically connected to the thin film transistor;
a second electrode disposed in a same layer as the first electrode; and
light emitting elements disposed between the first electrode and the second electrode and electrically connected between the first electrode and the second electrode.

11. The display device of claim 1, further comprising a display driver disposed on the flexible film and supplying a data voltage, a source voltage, or a gate signal.

12. A method of manufacturing a display device, comprising:
preparing a substrate;
forming a first barrier insulating film on the substrate, the first barrier insulating film including a first contact hole;
forming a fan-out line on the first barrier insulating film, the fan-out line including a pad in the first contact hole;
forming a display layer on the fan-out line;
forming a second contact hole so that a residual film of the substrate remains;
forming an electric conductor by carbonizing the residual film by irradiating the residual film with infrared laser beam; and
electrically connecting a flexible film to the electric conductor by disposing a portion of the flexible film in the second contact hole.

13. The method of claim 12, wherein the infrared laser beam has a femtosecond pulse.

14. The method of claim 12, wherein the forming of the second contact hole includes etching the substrate so that a thickness of the residual film is in a range of about 1/20 to about 1/5 of a thickness of the substrate.

15. The method of claim 12, wherein
the preparing of the substrate includes forming the substrate with a thickness in a range of about 5 μm to about 20 μm, and
the forming of the second contact hole includes etching the substrate so that a thickness of the residual film is in a range of about 0.5 μm to about 2 μm.

16. The method of claim 12, wherein the forming of the second contact hole includes irradiating the substrate with ultraviolet laser beam.

17. The method of claim 16, wherein the ultraviolet laser beam has a picosecond pulse.

18. The method of claim 12, wherein the electrically connecting of the flexible film to the electric conductor includes electrically connecting the flexible film to the electric conductor with a connection film.

19. The method of claim 18, wherein the electrically connecting of the flexible film to the electric conductor includes attaching the flexible film to the electric conductor by ultrasonic bonding or thermocompression bonding.

20. A tiled display device comprising:
a plurality of display devices each including a display area including a plurality of pixels and a non-display area disposed adjacent to the display area; and
a connecting member connecting the plurality of display devices to each other, wherein at least one of the plurality of display devices includes:
a substrate including a first contact hole and a residual film of the substrate, wherein the residual film of the substrate and the first contact hole overlapping overlap each other in a thickness direction;
an electric conductor provided in the residual film and having conductivity;
a first barrier insulating film disposed on the substrate and including a second contact hole;
a fan-out line disposed on the first barrier insulating film and including a pad disposed in the second contact hole, the pad electrically contacting the electric conductor;
a display layer disposed on the fan-out line; and
a flexible film disposed below the substrate, extending to the first contact hole, and electrically connected to the pad through the electric conductor.

* * * * *